United States Patent
Matsui et al.

(10) Patent No.: US 7,154,427 B2
(45) Date of Patent: Dec. 26, 2006

(54) ELECTRONIC CIRCUIT APPARATUS

(75) Inventors: Hirofumi Matsui, Kashiba (JP); Kunihiko Iizuka, Sakai (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/244,368

(22) Filed: Oct. 6, 2005

(65) Prior Publication Data

US 2006/0077088 A1  Apr. 13, 2006

(30) Foreign Application Priority Data

Oct. 7, 2004  (JP)  ............................. 2004-295365
Sep. 9, 2005  (JP)  ............................. 2005-263059

(51) Int. Cl.
*H03M 1/38*  (2006.01)

(52) U.S. Cl. ...................... 341/161; 341/160

(58) Field of Classification Search ......... 341/130–161
See application file for complete search history.

(56) References Cited

U.S. PATENT DOCUMENTS

| 5,617,037 | A |   | 4/1997 | Matsumoto |
| 6,339,388 | B1 | * | 1/2002 | Matsumoto ................. 341/120 |
| 6,734,817 | B1 | * | 5/2004 | Naka et al. ................. 341/155 |

FOREIGN PATENT DOCUMENTS

| JP | 5-297061 A | 11/1993 |
| JP | 8-68833 A | 3/1996 |
| JP | 2004-48383 A | 2/2004 |

OTHER PUBLICATIONS

Cho et al., "A 10 b 20 Msample/s, 35 mW Pipeline A/D Converter", IEEE Journal of Solid-State Circuits, vol. 30, No. 3, (1995), p. 166-172, "no month".
Karanicolas et al., "A 15-b 1-Msample/s Digitally Self-Calibrated Pipeline ADC", IEEE Journal of Solid-State Circuits, vol. 28 No. 12, (1993), pp. 1207-1214, "no month".
Chuang et al., "A Digitally Self-Calibrating 14-bit 10-MHz CMOS Pipelined A/D Converter", IEEE Journal of Solid-State Circuits, vol. 37, No. 6, (2002), pp. 674-683, "no month".

* cited by examiner

Primary Examiner—Lam T. Mai
(74) Attorney, Agent, or Firm—Birch, Stewart, Kolasch & Birch, LLP

(57) ABSTRACT

A circuit including analog circuits processes an analog input signal. Further, the circuit including the analog circuits sends a coefficient to a coefficient detection/control circuit. The coefficient is indicative of a predetermined property of each of the analog circuits provided in the circuit. The coefficient detection/control circuit processes and detects the coefficient as a signal, with the result that the property of the analog circuit is detected. Then, the coefficient detection/control circuit sends a control signal to the circuit including the analog circuits. The control signal is generated according to a result of the detection of the coefficient. In accordance with the control signal, the coefficient detection/control circuit adjusts an operation state of the analog circuit so as to control an operation of the circuit including the analog circuits. The coefficient is sent from an external output terminal to outside. By monitoring the coefficient thus sent, circuit quality judgment is carried out.

27 Claims, 12 Drawing Sheets

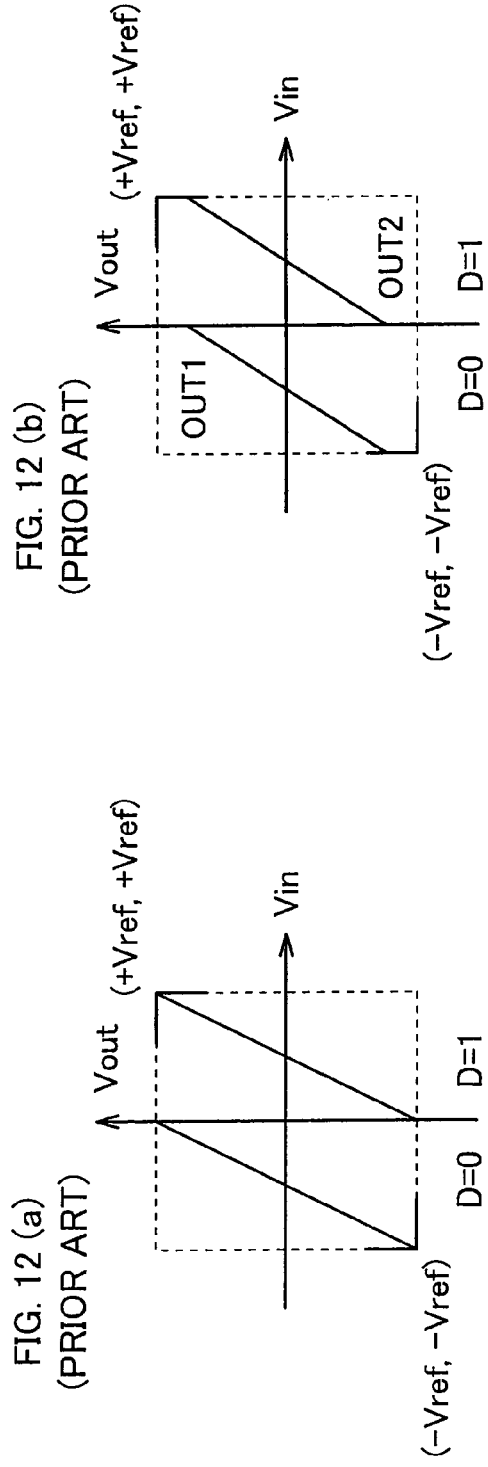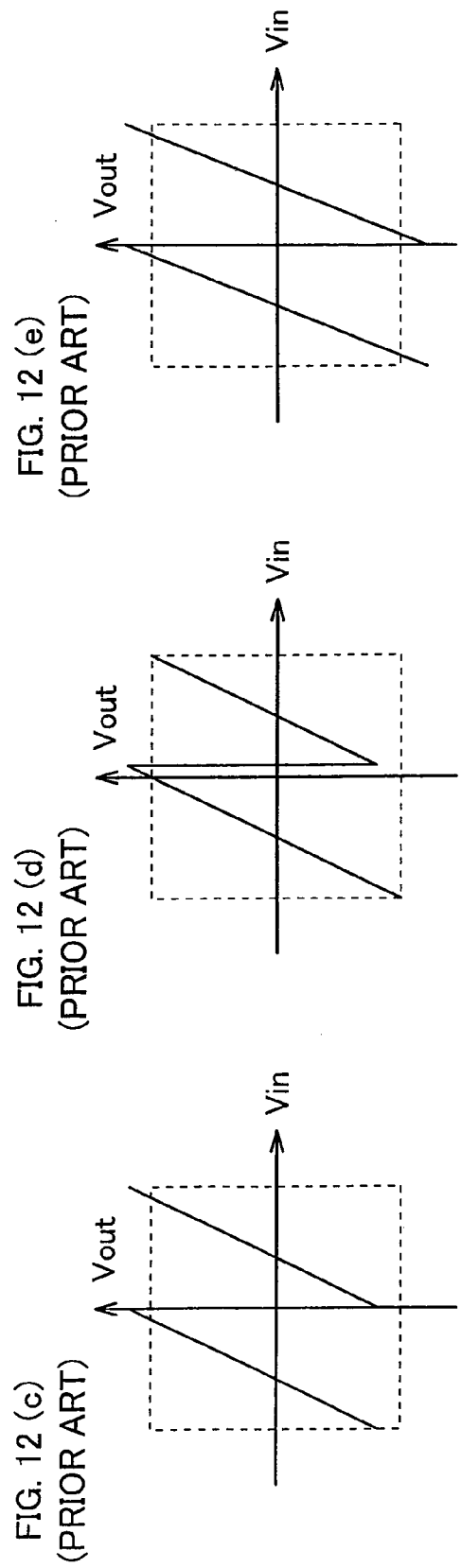

ELECTRONIC CIRCUIT APPARATUS

This Nonprovisional application claims priority under 35 U.S.C. § 119(a) on Patent Application No. 2004/295365 filed in Japan on Oct. 7, 2004, and Patent Application No. 2005/263059 filed in Japan on Sep. 9, 2005, the entire contents of which are hereby incorporated by reference.

FIELD OF THE INVENTION

The present invention relates to a technique for carrying out, with ease and at low cost, a test of judging quality of a circuit including an analog circuit such as an AD (analog-to-digital) conversion circuit and a DA (digital-to-analog) conversion circuit.

BACKGROUND OF THE INVENTION

Conventionally, for quality judgment of a circuit including analog circuits such as an AD conversion circuit and a DA conversion circuit, an evaluation circuit needs to be provided in advance in the circuit so as to carry out a test for evaluating the performance of the circuit. However, the evaluation circuit thus provided causes property change of each of the analog circuits, and requires an external high accuracy evaluation apparatus.

In light of such problems, a technique disclosed in Japanese Unexamined Patent Publication Tokukaihei 08-68833/1996 (published on Mar. 12, 1996; hereinafter, referred to as "Patent document 1") makes it possible to acquire a property of the DA conversion circuit, for example, in the following manner. That is, the circuit is arranged such that an output terminal of the DA conversion circuit is connectable to an input terminal of the AD conversion circuit, and test data is used as reference data.

Further, proposed in each of Japanese Unexamined Patent Publication Tokukaihei 05-297061/1993 (published on Nov. 12, 1993; hereinafter, referred to as "Patent document 2"), Japanese Unexamined Patent Publication Tokukai 2004-48383/2004 (published on Feb. 12, 2004; hereinafter referred to as "Patent document 3"), and the like is a method using an FFT (Fast Fourier Transform) circuit provided in addition to the DA conversion circuit and the AD conversion circuit. A specific example of the FFT circuit is a DSP (digital signal processing) circuit. Specifically, the FFT circuit thus provided is used to acquire respective properties of the DA conversion circuit and the AD conversion circuit, and the properties thus acquired are automatically corrected, and the properties thus corrected are used for the evaluation.

The technique of the patent document 1 requires a highly accurate analog signal for the test of the AD conversion circuit, and merely allows acquirement of an output result obtained through two circuits. Therefore, it is difficult to distinguish which one of the two circuits caused an obtained error. On the other hand, the technique proposed in each of Patent documents 2 and 3 etc., requires the FFT circuit, so that the test requires expensive cost.

Further, such a circuit including the analog circuits generally suffers from (i) a problem in a relation between high accuracy and low power consumption, and (ii) a problem in a relation between a margin in designing and the low power consumption. The following explains the problems.

A specific example of the circuit including the analog circuits is the AD conversion circuit for converting an analog input value into a digital value. Described fully in "A 10 b, 20 Msample/s, 35 mW Pipeline A/D Converter", *IEEE JOURNAL OF SOLID-STATE CIRCUITS*, VOL. 30, NO. 3, MARCH 1995 (hereinafter, referred to as "Non-patent document 1") is a pipeline AD conversion circuit for carrying out high speed AD conversion in a plurality of stages. FIG. 11 illustrates a structure of such a pipeline AD conversion circuit 100. The pipeline AD conversion circuit 100 includes a plurality of stages (STAGE 1 through STAGE N) 106 through 109. The k-th one (STAGE k; k=1 through N−1) of the stages includes a sub AD converter 101, a sub DA converter 102, an adder 103, and an n-time amplifier 104. The sub AD converter 101 carries out AD conversion with respect to an input signal Vres(k−1), and outputs a digital value Dk. The sub DA converter 102 converts (i) the digital value DK obtained as the result of the AD conversion carried out by the sub AD converter 101, into (ii) an analog value. The adder 103 adds (i) the output of the sub DA converter 102, to (ii) the input signal Vres(k−1). The n-time amplifier 104 amplifies (multiplies) the addition result by n times, and carries out an analog output thereof. Described here is an example in which the addition result is multiplied by 2. Further, hereinafter in the present application, this multiple number is referred to as "gain". Respective functions of the adder 103 and such a two-time amplifier 104 are realized by a two-time amplifier circuit 111. The two-time amplifier circuit 111 sends an analog signal Vres(k) to a next stage. Moreover, the pipeline AD conversion circuit 100 further includes a bias voltage generation circuit 105 for generating and sending a bias voltage Vb to the n-time amplifier 104. The application of the bias voltage Vb causes the n-time amplifier 104 to operate.

The first stage 106 outputs a digital output D1, which serves as an MSB (Most Significant Bit). The two-time amplifier circuit 111 in the stage 107 coming just after the first stage 106 amplifies, by 2, a difference between an input signal Vres2 and the digital value D1. Accordingly, the stage 107 outputs a digital output D2 whose weight is the half of that of the MSB. Each of stages coming after the stage 107 until the last stage (Stage N) 109 outputs a digital output, and sends, to a next stage, an analog signal obtained by multiplying, by two, a difference between (i) an analog signal received by the stage and (ii) the digital output sent from the stage. In the structure of this case, the last stage (STAGE N) does not need to send a signal to a next stage, so that the last stage is merely made up of the sub AD converter 101. The N-number of stages required according to required accuracy (bit number) N are connected to one another in the form of a pipeline as shown in FIG. 11, thus constituting the pipeline AD conversion circuit 100. Further, the respective digital outputs from the stages are combined by an error correction circuit 110, and the error correction circuit 110 outputs the combined digital output as a final digital output Dout sent from the pipeline AD conversion circuit 100. The pipeline AD conversion circuit 100 carries out the process in the pipeline manner as such, so that each of the stages can operate at an operation speed equal to conversion speed. Therefore, the conversion speed, the accuracy, and the current consumption are excellently balanced in the pipeline AD conversion circuit 100, so that the pipeline AD conversion circuit 100 is most frequently used as a 10-bit AD conversion circuit through a 12-bit AD conversion circuit, each of which deals with up to several ten M samples.

Explained next is a structure of the switched capacitor circuit (n-time amplifier circuit) 111 realizing the respective functions of the adder 103 and the n-time amplifier 104 of each stage. In this structure example, the gain is two, so that the switched capacitor circuit 111 serves as a two-time amplifier circuit 111. Such a two-time amplifier circuit 111 is so arranged as to amplify, by two, the difference between the input signal Vres(k−1) and the signal VDAC sent from the sub DA converter 102, and as to send the signal Vres(k) in the form of a differential output. Further, the two-time amplifier circuit 111 includes an amplifier 112; switches SW1, SW2, and SW3; and capacitors Cf and Cs. Note that, FIG. 11 illustrates only one of two circuits connected to the differential input terminals of the amplifier 112, and does not illustrate the other circuit connected thereto because the other circuit is provided symmetrically to the circuit. The amplifier 112 receives the aforementioned bias voltage Vb. Each of the capacitors Cf and Cs has an electrode connected to an input terminal of the amplifier 112. The switch SW1 switchably connects the other electrode of the capacitor Cf to one of (i) the input terminal for receiving the input signal Vres(k−1), and (ii) the output terminal of the amplifier 112. The switch SW2 switchably connects the other electrode of the capacitor Cs to one of (i) the input terminal for receiving the input signal Vres(k−1), and (ii) the input terminal for receiving the signal VDAC. The switch SW3 connects the input terminal of the amplifier 112 to an input terminal for receiving a reference voltage Vref, and disconnects the input terminal of the amplifier 112 from the input terminal for receiving the reference voltage Vref.

While the two-time amplifier circuit 111 thus arranged is in a mode of sampling the input signal Vres(k−1), the switch SW1 connects the other electrode of the capacitor Cf to the input terminal for receiving the input signal Vres(k−1). The switch SW2 connects the other electrode of the capacitor Cs to the input terminal for receiving the input signal Vres(k−1). The switch SW3 connects the input terminal of the amplifier 112 to the input terminal for receiving the reference voltage Vref. This causes each of the capacitors Cf and Cs to accumulate an electric charge determined by a difference between the voltage of the input signal Vres(k−1) and the reference voltage Vref.

On the other hand, while the two-time amplifier circuit 111 is in a hold mode of sending the output signal Vres(k), the switch SW1 connects the other electrode of the capacitor Cf to the output terminal of the amplifier 112. The switch SW2 connects the other electrode of the capacitor Cs to the input terminal for receiving the signal VDAC. The switch SW3 disconnects the input terminal of the amplifier 112 from the input terminal for receiving the reference voltage Vref. This allows retainment of the total electric charge accumulated in the respective electrodes of the capacitors Cf and Cs, and allows the input terminal of the amplifier 112 to receive a voltage determined by the signal VDA and the output voltage of the amplifier 112.

The following formula 1 expresses a relation between (i) the input to each stage including such a two-time amplifier circuit 111, and (ii) the output therefrom:

$$V_{res1} = 2 \cdot (V_{res0} - V_{DAC}) \quad V_{DAC} = \pm 0.5 Vr, 0 \qquad \text{[Formula 1]}$$

In consideration of a device property, the formula 1 is modified to the following formula 2:

$$V_{res1} = \left(1 + \frac{C_s}{C_f}\right) \cdot \left(\frac{1}{1 + \frac{1}{Af}}\right) \cdot (V_{res0} - V_{DAC}) V_{DAC} \qquad \text{[Formula 2]}$$
$$= \pm 0.5 Vr, 0$$

where "A" indicates a DC gain of the amplifier 112, and "f" indicates a feedback factor. The formula 2 allows no deviation of a ratio of the respective capacitances of the capacitors Cs and Cf. In other words, in accordance with the formula 2, the actual ratio of the capacitances of the capacitors Cs and Cf are equal to the ideal ratio of the capacitances of the capacitors Cs and Cf. In cases where "A" is infinite, the formula 2 is equal to the formula 1.

Each of FIG. 12(a) through FIG. 12(e) illustrates the relation between (i) the input voltage Vin (input signal Vres(k−1)) applied to the two-time amplifier circuit 111, and (ii) the output voltage Vout (output signal Vres(k)) from the two-time amplifier circuit 111. Specifically, FIG. 12(a) illustrates a designed input/output relation. In the designed input/output relation, when the bit value judgment result (the digital value Dk) sent from the sub AD converter 101 is 1, the two-time amplifier circuit 111 outputs a voltage obtained by multiplying, by two, a voltage obtained by subtracting a threshold value from the voltage received by the sub AD converter 101. On the other hand, when the bit value judgment result (the digital value Dk) is 0, the two-time amplifier circuit 111 outputs a voltage obtained by multiplying, by two, the voltage received by the sub AD converter 101. The output voltage Vout falls within a range from −Vref to +Vref. Further, an input voltage Vin equal to the threshold voltage is indicative of 0.

Each of FIG. 12(b) through FIG. 12(d) illustrates a case where the amplifier manufacture fluctuation causes the input/output relation to deviate from the ideal input/output relation. Specifically, FIG. 12(b) illustrates a case where the output voltage Vout falls within a range smaller than the foregoing range from −Vref to +Vref. FIG. 12(c) illustrates a case where: an electric charge irrelevant to the signal is accumulated, as an offset electric charge, in each of the capacitors Cf and Cs during the aforementioned sampling mode and the hold mode in each of which the electric charge is injected to the capacitors Cf and Cs, with the result that the output voltage Vout falls out of the foregoing range. FIG. 12(d) illustrates a case where the offset phenomenon causes the output voltage Vout to deviate from the target voltage corresponding to the input voltage Vin. The wording "offset phenomenon" refers to such a phenomenon that changes the threshold voltage with which a comparison device of the sub. AD converter 101 compares the input voltage Vin. This causes the comparison device to output a value determined in accordance with the threshold voltage thus changed from the original threshold value. FIG. 12(e) illustrates a case where the deviation of the ratio of the respective capacitances of the capacitors Cs and Cf causes the input/output relation to deviate from the ideal input/output relation.

In fact, degree of deviation of each capacitance of the capacitors Cs and Cf is in inverse proportion to the square root of each capacitance of the capacitors Cs and Cf. Therefore, in cases where the pipeline AD conversion circuit is applied to a 12 bit or greater high accuracy AD conversion circuit, the first stage needs to have a considerably large capacitance, and the amplifier 104 needs to have a considerably high DC gain A. This causes circuit area increase and electric current consumption increase. Therefore, it is difficult to use the pipeline structure directly for an application having limitation in electric current consumption such as a mobile phone. So, considered in each of "A 15 b, 1-Msample/s Digitally self-Calibrated Pipeline ADC", *IEEE JOURNAL OF SOLID-STATE CIRCUITS,* VOL. 28, NO. 12, DECEMBER 1993 (hereinafter, referred to as "Non-patent document 2") and "A Digitally Self-Calibrating 14-bit 10-MHz CMOS Pipelined A/D Converter", *IEEE JOURNAL OF SOLID-STATE CIRCUITS,* VOL. 37, NO. 6, JUNE 2002 (hereinafter, referred to as Non-patent document 3) is a method for correcting such static properties of the analog circuit, i.e., the capacitance deviation and the DC gain of the amplifier 104 by way of processing carried out by a digital circuit. In other words, not only the analog circuit designing but also the correction by the digital circuit are used for the realization of the accuracy.

Further, even in the case where the correction is carried out with the use of the digital circuit, the analog circuit such as the pipeline AD conversion circuit is normally designed with a margin, in consideration of the device unevenness, device distortion, or the like. However, an excessive margin causes electric power consumption increase and area increase, thereby causing cost increase.

For example, the MOS transistors constituting the amplifier 112 shown in FIG. 11 inevitably have uneven threshold values in an IC chip or among IC chips, when being manufactured. For this reason, a voltage to be applied to each of the MOS transistors is an operation voltage allowing a normal operation of an MOS transistor having the highest threshold value. With this, all the MOS transistors normally operate. Such a sufficient operation voltage setting is one example of the designing with the margin. In this case, under such a sufficient operation voltage, a large amount of current is supplied to an MOS transistor having a low threshold value, and a smaller amount of current is supplied to an MOS transistor having higher threshold value. Accordingly, such a margin in the operation voltage causes electric power consumption increase in the circuit portion including the MOS transistor to which a large amount of current is supplied.

FIG. 13 illustrates a settling behavior of the output voltage Vout of each two-time amplifier circuit 111 including the amplifier 112, in the above example. Specifically, FIG. 13 illustrates how large the output voltage Vout is in a predetermined time t after the start of the hold mode during which the two-time amplifier circuit 111 outputs the output voltage. The output voltage Vout varies according to manufacturing variation of the manufactured two-time amplifiers 111. The output voltage Vout needs to be settled down to a predetermined voltage V1, in the predetermined time t1. As shown in curved lines c1 through c5, time (settling time) required for the settling to the predetermined voltage V1 in each two-time amplifier circuit 111 is changed according to a current supplied to the amplifier 112. Specifically, in the amplifier 112 to which the large current is supplied, the output voltage Vout is raised at a large through rate as shown in the curved line c1, so that the settling time is short. On the other hand, in the amplifier 112 to which the small current is supplied, the output voltage Vout is raised at a small through rate as shown in the curved line c4, so that the settling time is long. Further, in cases where the current flowing therethrough is too small, it takes more than the predetermined time t1 for the output Vout to reach the predetermined voltage V1 as shown in the curved line c5, with the result that a normal output voltage Vout cannot be obtained within the sampling interval. The margin corresponds to the length of a settlement period starting from (i) the time at which the output voltage Vout reaches the predetermined voltage V1, to (ii) the predetermined time t1. As such, the circuit designed with a large margin allows short settling time, but consumes a large electric power. Note that, this examination disregards (i) an ON-resistance of each switch, and (ii) time constant according to a parasitic component of each wire.

Further, in cases where an analog circuit having a constant settling behavior is used for an application having variable sampling speed, the settling time of the output voltage Vout is constant irrespective of the sampling speed. However, the following problem arises when the sampling time is increased. That is, the sampling time increase lengthen, by the length of the increased sampling time, the period of time starting from (i) the time at which the voltage Vout is settled, to (ii) the time at which the output voltage Vout is extracted. Therefore, the margin is unnecessarily large in the mode having such a long sampling time. For example, see a case where the sampling is carried out at such a speed that allows the output voltage Vout to reach the predetermined voltage V1 in predetermined time t2 longer than the predetermined time t1, as shown in FIG. 13. In this case, the settling behavior indicated by the curved line c5 is sufficient; however, in cases where the MOS transistor receives a current which brings the output voltage Vout to the predetermined voltage V1 in the predetermined time t1, the settlement period becomes longer by time found by "t2-t1", as compared with the aforementioned case. As such, even when the sampling speed is changed, the current consumption of the analog circuit is constant, so that the current consumption exceeds the required amount when the sampling speed is slow.

Considered to solve the problems are: (i) preparation of a plurality of bias voltage generation circuits for respectively supplying bias voltages to amplifiers; (ii) a bias voltage generation circuit that is so arranged as to be capable of varying a voltage to be supplied therefrom; and the like. However, analog circuits are generally caused to have uneven properties when being manufactured, so that each property of analog circuits to be manufactured cannot be predicted. Therefore, even when there is provided such a bias voltage generation circuit capable of varying the output value, it is still difficult to determine a value at which the output value is set.

SUMMARY OF THE INVENTION

An object of the present invention is to provide an electronic circuit apparatus for (i) detecting, as coefficients, predetermined properties of analog circuits which are so manufactured as to be varied, and adjusting an electric power of each of the analog circuits in accordance with each of the predetermined property so as to reduce electric power consumption in each of the analog circuits while securing, from deterioration, accuracy whose realization is difficult only by way of parameter control; and (ii) allowing easy and low cost quality judgment of the electronic circuit apparatus, which judgment is carried out upon manufacturing the electronic circuit apparatus.

To achieve the object, an electronic circuit apparatus of the present invention includes: (i) an analog circuit; (ii) a detection circuit for detecting a predetermined property of the analog circuit as a coefficient; and (iii) a control circuit for adjusting electric power consumption of the analog circuit in accordance with a detection result acquired from the detection circuit, the coefficient detected by the detection circuit being sent out from an external output terminal.

The above invention makes it possible to detect, as coefficients, predetermined respective properties of the analog circuits which are so manufactured as to be varied, and to control the analog circuit by adjusting electric power consumption of the analog circuit in accordance with the property thus found. This allows for (i) accuracy improvement whose realization is difficult merely by way of the parameter control of the analog circuit, (ii) electric power consumption reduction, and (iii) easy and low cost quality judgment of the electronic circuit apparatus, which judgment is carried out upon manufacturing the electronic circuit apparatus.

To solve the problems, another electronic circuit apparatus of the present invention includes: (i) an analog circuit; (ii) a detection circuit for detecting a predetermined property of the analog circuit as a coefficient; and (iii) a control circuit for adjusting current consumption of the analog circuit in accordance with a detection result acquired from the detection circuit, the coefficient detected by the detection circuit being sent out from an external output terminal.

The above invention makes it possible to detect, as coefficients, respective predetermined properties of the analog circuits which are so manufactured as to be varied, and to control the analog circuit by adjusting current consumption of the analog circuit in accordance with the property thus found. This allows for (i) accuracy improvement whose realization is difficult merely by way of the parameter control of the analog circuit, (ii) current consumption reduction, and (iii) easy and low cost quality judgment of the electronic circuit apparatus, which judgment is carried out upon manufacturing the electronic circuit apparatus.

Additional objects, features, and strengths of the present invention will be made clear by the description below. Further, the advantages of the present invention will be evident from the following explanation in reference to the drawings.

Each of FIG. 12(a) through FIG. 12(e) is a graph illustrating an input/output relation of an amplifier.

Figure 13:
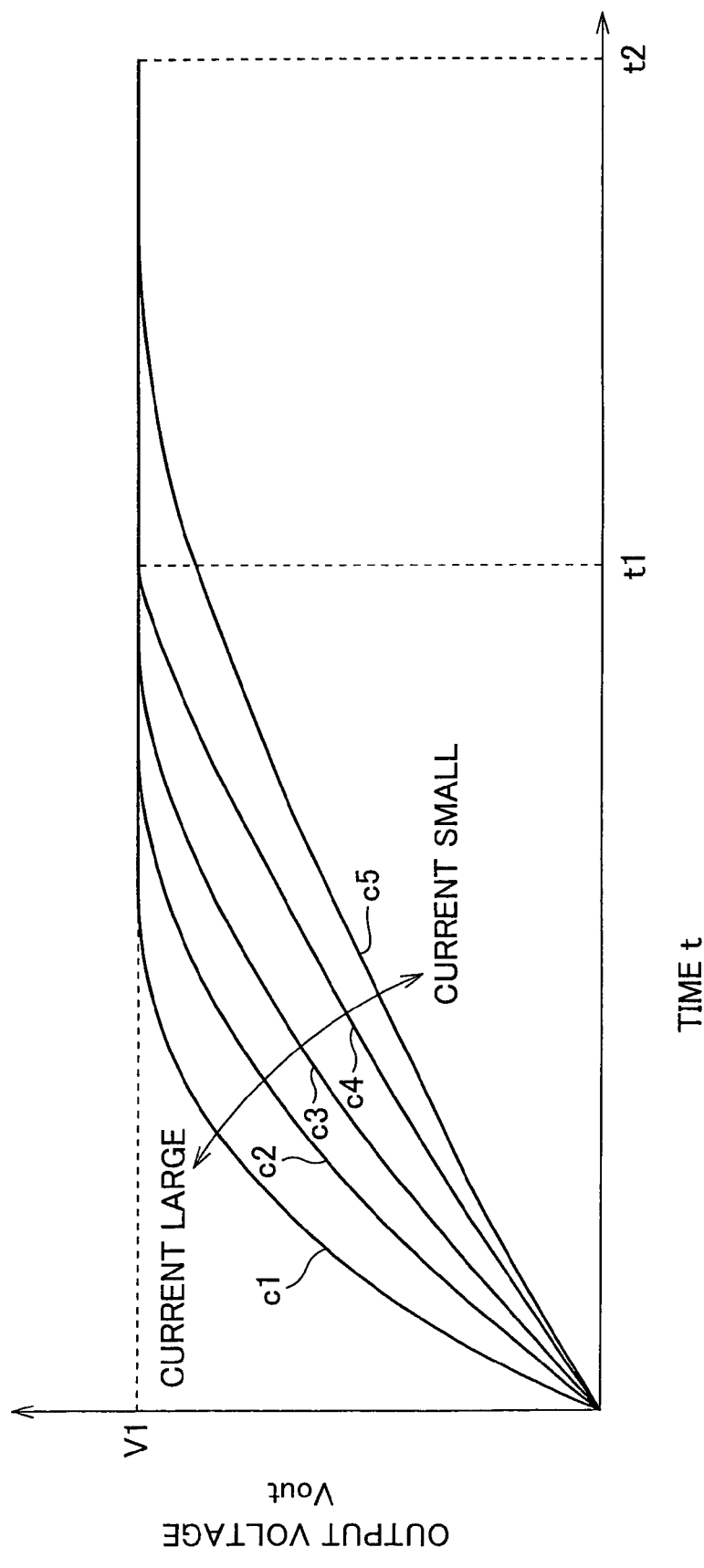

FIG. 13 is a graph illustrating settling properties of the amplifier.

DESCRIPTION OF THE EMBODIMENTS

[Embodiment 1]

Figure 1:
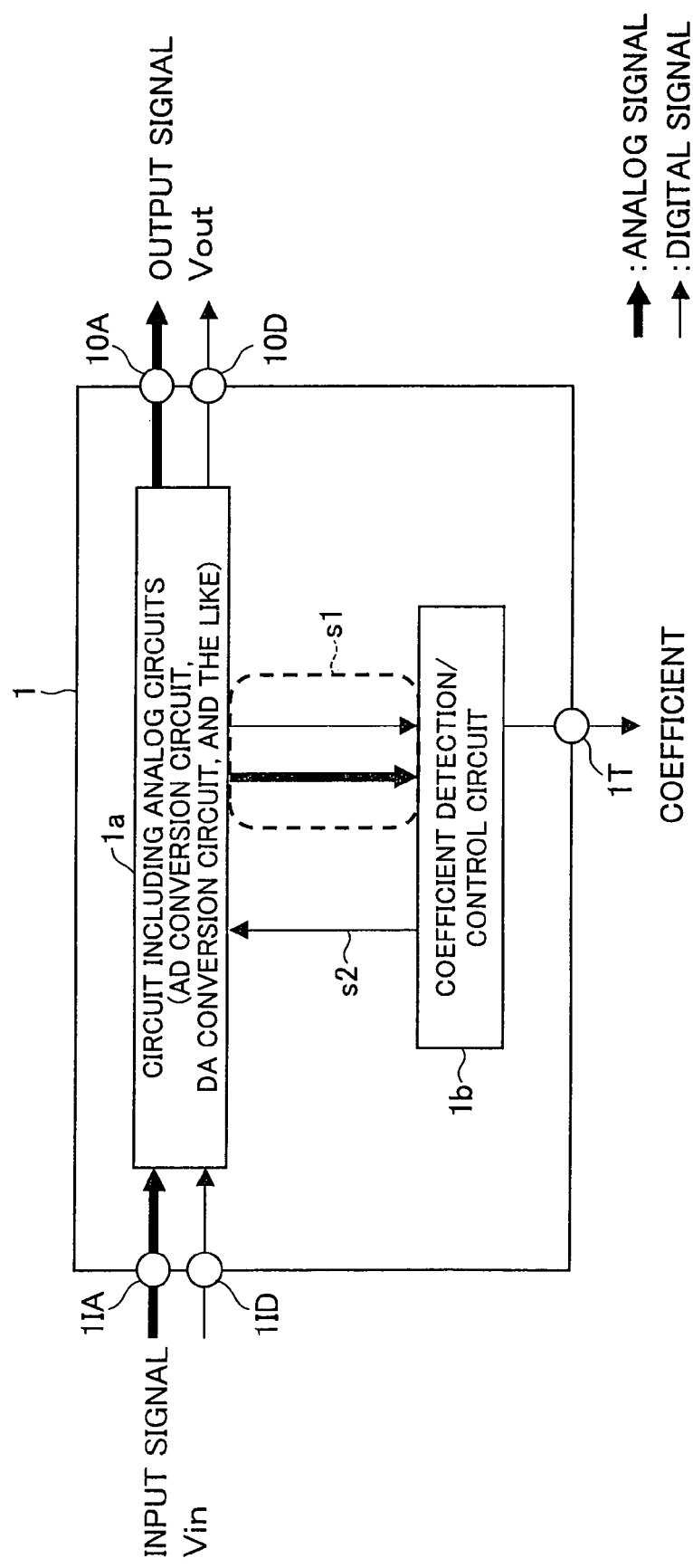
FIG. 1 is a block diagram illustrating a structure of a major part of a first electronic circuit apparatus of Embodiment 1 of the present invention.

FIG. 1 is a schematic diagram illustrating an analog circuit equipped circuit 1 (electronic circuit apparatus) according to the present embodiment. The analog circuit equipped circuit 1 is structured as an IC (integrated circuit), and includes a circuit 1a including analog circuits, a coefficient detection/control circuit 1b, and an external output terminal 1T for sending a detected coefficient to the outside of the IC. The circuit 1a including each of the analog circuits processes an analog input signal Vin received via each of input terminals 1IA and 1ID of the IC. Then, the circuit 1a sends a result of the processing in the form of, e.g., an output signal Vout, via each of output terminals 10A and 10D of the IC as shown in FIG. 1. Further, the circuit 1a including the analog circuit sends a coefficient s1 to the coefficient detection/control circuit 1b. The coefficient s1 is indicative of a predetermined property of the analog circuit. Note that a power source system terminal, a reference voltage system terminal, and a clock terminal are omitted in FIG. 1.

Examples of the predetermined property include: (i) a voltage in a predetermined location of the analog circuit; (ii) a current in a predetermined location of the analog circuit; (iii) a value expressed by using the voltage or the current; and the like. Detection of such a predetermined property upon manufacturing makes it possible to find the manufacture unevenness of the analog circuits.

Moreover, the predetermined property encompasses a property including an influence exerted by a condition outside each of the analog circuits. Detection of such a predetermined property while a user uses the analog circuit makes it possible to find (i) the manufacture unevenness of the analog circuits, (ii) how the analog circuits are used, and (iii) secular variation of the analog circuits. Examples of the influence exerted by the condition outside each of the analog circuits include: (i) an influence exerted by a level of the input signal sent to the analog circuit, (ii) an influence exerted by temperature of the analog circuit, and the like. Specifically, when the analog circuit receives the input signal having a range smaller than a dynamic range prepared by the analog circuit, the analog circuit outputs a signal whose range is narrower than the dynamic range. As such, the range of the input signal affects an operation state of the analog circuit. Meanwhile, see the following example of the influence exerted when the temperature of the analog circuit is changed. That is, rise in the temperature of the analog circuit causes a change of the threshold of an MOS transistor, with the result that an appropriate operation state (voltage/current state) of the analog circuit is changed. As such, the temperature affects the operation state of the analog circuit.

Therefore, in cases where at least either (i) the property detected upon manufacturing the analog circuit, or (ii) the property detected upon using the analog circuit is targeted, a property beneficial for the user can be found by a below-mentioned coefficient detection circuit of the coefficient detection/control circuit 1b. The coefficient thus acquired by the coefficient detection circuit is sent from the external output terminal 1T to the outside of the IC. By monitoring the coefficient thus sent, the quality judgment of the circuit can be carried out. This is also true in embodiments described below.

The coefficient s1 is a value of a signal, and may be an analog signal or a digital signal. Note that a digital signal in the structure of FIG. 1 is not necessarily a 1-bit digital signal but a digital signal that has a predetermined bit width and that is transmitted through a general bus. Further, the digital signal may be serial data or parallel data. The coefficient detection circuit (detection means) of the coefficient detection/control circuit 1b processes and detects the coefficient s1 as a signal, with the result that the predetermined property of the analog circuit is detected as a coefficient. In cases where the coefficient s1 is a digital signal, the coefficient detection/control circuit 1b may detect the predetermined property in accordance with (i) the digital value of the coefficients s1 or (ii) a value obtained by processing the digital value. Further, a control circuit (control means) of the coefficient detection/control circuit 1b sends, to the circuit 1a including the analog circuit, a control signal s2 generated according to the detection result of the coefficient s1. The control signal s2 may be an analog signal or may be a digital signal. In accordance with the control signal s2 the coefficient detection/control circuit 1b adjusts the operation state of the analog circuit so as to control the operation of the circuit 1a including the analog circuit.

The coefficient s1 may be either (i) a signal found merely for the adjustment of the operation state of the analog circuit, or (ii) a signal also for use in correcting an analog output result of the analog circuit by using a below-mentioned correction circuit.

The adjustment of the operation state of the analog circuit makes it possible that: (i) the predetermined property is kept desirable so as not to affect the result of the processing carried out by the circuit 1a including the analog circuit, a specific example of the result being the value of the output voltage Vout obtained in accordance with the input voltage Vin; and (ii) the circuit 1a is controlled such that the analog circuit of the circuit 1a consumes an electric power as small as possible. That is, even though the properties of the analog circuits are uneven, electric power consumption reduction can be attained in accordance with each property of the analog circuits. Further, the aforementioned conventional analog circuit designing uses the circuit, which varies the parameter of the analog circuit and which is provided together with the analog circuit. The circuit is used such that the margin does not become excessively large. The circuit carries out the parameter setting so as to deal with (i) each of the uneven properties of the analog circuits to be manufactured, and (ii) various usage modes. However, each property of the analog circuits to be manufactured is not predictable when manufacturing each of the analog circuits. Thus, it is difficult to carry out appropriate parameter setting after the manufacturing. In contrast, the structure shown in FIG. 2 detects the property of the manufactured analog circuit, with the result that the manufactured analog circuit can be used with good accuracy.

Note that, when the detection means detects the property including the influence exerted by the condition outside the analog circuit, the control means carries out control such that, e.g., a current is reduced for an irrelevant region of the dynamic range prepared by the analog circuit. The irrelevant region of the dynamic range refers to such a region that does not need to operate, and can be found by detecting the range of the output signal. Such detection can be carried out because, e.g., when the range of the input signal is smaller than the dynamic range prepared by the analog circuit, the range of the output signal is accordingly small. Further, the temperature rise in the analog circuit causes the threshold change of the MOS transistor, with the result that the current to be supplied to the MOS transistor is changed. The current thus changed is detected, and the control means carries out control such that a voltage to be applied to the MOS transistor is adjusted in accordance with the current thus detected, i.e., the control is carried out such that the current is adjusted. This is also true in embodiments described below.

Note that all the embodiments including the present embodiment assume that: a power source voltage of the analog circuit always falls within a variation range, under condition that the current consumption can be reduced. This allows reduction of the electric power consumption. Further, the method for reducing the electric power consumption is not limited to this. The electric power consumption may be reduced by (i) reducing the voltage while keeping the current constant, or (ii) reducing the current and the voltage.

As such, the structure shown in FIG. 1 finds the coefficient indicative of (i) each of the uneven predetermined properties of the analog circuits, and (ii) the operation state including the condition outside each of the analog circuits. Further, the structure can control the circuit including the analog circuit, by adjusting the operation state of the analog circuit in accordance with the predetermined property thus found. This allows for (i) accuracy improvement whose realization is difficult merely by controlling the parameter of the analog circuit, and (ii) current consumption reduction. Further, by monitoring the coefficient sent from the output terminal to the outside of the electronic circuit apparatus, the test for judging the quality of the electronic circuit apparatus can be easily carried out at a low cost.

Figure 2:
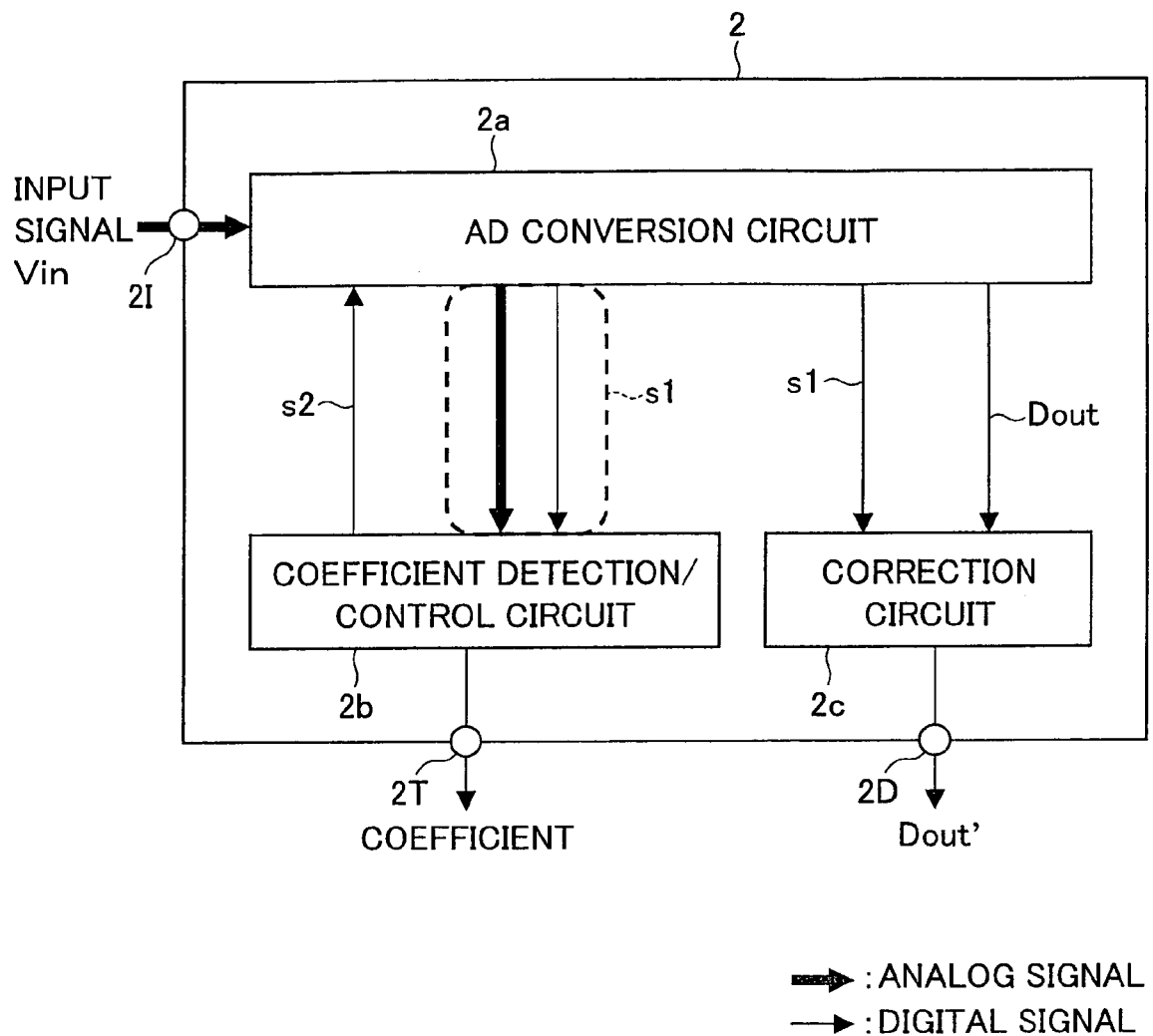
FIG. 2 is a block diagram illustrating a structure of a major part of a second electronic circuit apparatus of Embodiment 1 of the present invention.

FIG. 2 illustrates a structure of an AD conversion circuit equipped circuit (electronic circuit apparatus) 2 according to the present embodiment. The AD conversion circuit equipped circuit 2 is an IC, and constitutes a correction type AD conversion circuit. Specifically, the AD conversion circuit equipped circuit 2 includes an AD conversion circuit 2a, a coefficient detector/control circuit 2b, a correction circuit 2c, and an external output terminal 2T for sending a detected coefficient to the outside of the IC. The AD conversion circuit (circuit including analog circuits) 2a receives an analog input signal Vin from an input terminal 2I of the IC, and carries out AD conversion with respect to the input signal Vin, and sends, to the correction circuit 2c, a digital output Dout obtained by the AD conversion. Further, the AD conversion circuit 2a sends a coefficient s1 to the coefficient detection/control circuit 2b and the correction circuit 2c. The coefficient s1 is indicative of a predetermined property of each of the analog circuits provided in the AD conversion circuit 2a. Note that a power source system terminal, a reference voltage system terminal, a clock terminal are omitted in FIG. 2.

The coefficient s1 is a value of a signal, and may be an analog signal or a digital signal. Note that a digital signal in the structure of FIG. 2 is not necessarily a 1-bit digital signal, but a digital signal that has a predetermined bit width and that is transmitted through a general bus. Further, the coefficient s1 may be serial data or parallel data.

So, a property beneficial for the user can be found by a below-mentioned coefficient detection circuit of the coefficient detection/control circuit 2b, in accordance with the predetermined property targeted for the detection. Further, the coefficient thus detected by the coefficient detection circuit of the coefficient detection/control circuit 2b is sent from the external output terminal 2T to the outside of the IC. By monitoring the coefficient thus sent, the test for the quality judgment of the circuit can be carried out. Further, the coefficient detection circuit (detection means) of the coefficient detection/control circuit 2b processes and detects the coefficient s1 as a signal, with the result that the coefficient detection circuit detects the predetermined property of the analog circuit as a coefficient. In cases where the coefficient s1 is a digital signal, the coefficient detection circuit may detect the predetermined property in accordance with (i) the digital value of the coefficient s1 or (ii) a value obtained by processing the digital value. Further, a control circuit (control means) of the coefficient detection/control circuit 2b generates a control signal s2 according to the detection result of the coefficient s1 and sends the control signal s2 to the AD conversion circuit 2a. The control signal s2 may be an analog signal or may be a digital signal. In accordance with the control signal s2 the coefficient detection/control circuit 2b adjusts the operation state of the analog circuit so as to control the operation of the AD conversion circuit 2a.

In accordance with a result of the control, the AD conversion circuit 2a outputs the digital output Dout. The correction circuit (correction means) 2c corrects the digital output Dout in accordance with the coefficient s1 and sends a digital output Dout', which is obtained by correcting the digital output Dout, to the outside of the IC via an output terminal 2D. When each of the uneven properties of the analog circuits of the AD conversion circuit 2a causes the input/output relation in the AD conversion to be undesirable, an AD conversion error occurs. However, the correction circuit 2c corrects such an AD conversion error.

The adjustment of the operation state of each of the analog circuits makes it possible that: (i) each of the predetermined properties is kept desirable so as not to, e.g., affect the value of the digital output Dout obtained in accordance with the input voltage Vin, and (ii) the AD conversion circuit 2a is controlled such that the analog circuit consumes electric power as small as possible. That is, even though the respective properties of the analog circuits are uneven, electric power consumption reduction can be attained according to each property of the analog circuits. Further, the aforementioned conventional analog circuit designing uses the circuit, which varies the parameter of the analog circuit and which is provided together with the analog circuit. The circuit is used such that the margin does not become excessively large. The circuit carries out the parameter setting so as to deal with (i) each of the uneven properties of the analog circuits to be manufactured, and (ii) various usage modes. However, each property of the analog circuits to be manufactured is not predictable when manufacturing each of the analog circuits. Thus, it is difficult to carry out appropriate parameter setting after the manufacturing. In contrast, the structure shown in FIG. 2 detects the property of the manufactured analog circuit, with the result that the manufactured analog circuit can be used with good accuracy.

As such, the structure shown in FIG. 2 finds the coefficient indicative of (i) each of the uneven predetermined properties of the analog circuits, and (ii) the operation state including the condition outside the analog circuit. Further, the structure can control the AD conversion circuit, by adjusting the operation state of the analog circuit in accordance with the predetermined property and the operation state thus found. This allows for (i) accuracy improvement whose realization is difficult merely by controlling the parameter of the analog circuit, and (ii) current consumption reduction. Further, by monitoring the coefficient sent from the external output terminal to the outside of the electronic circuit apparatus, the test for judging the quality of the electronic circuit apparatus can be easily carried out at a low cost.

Figure 3:
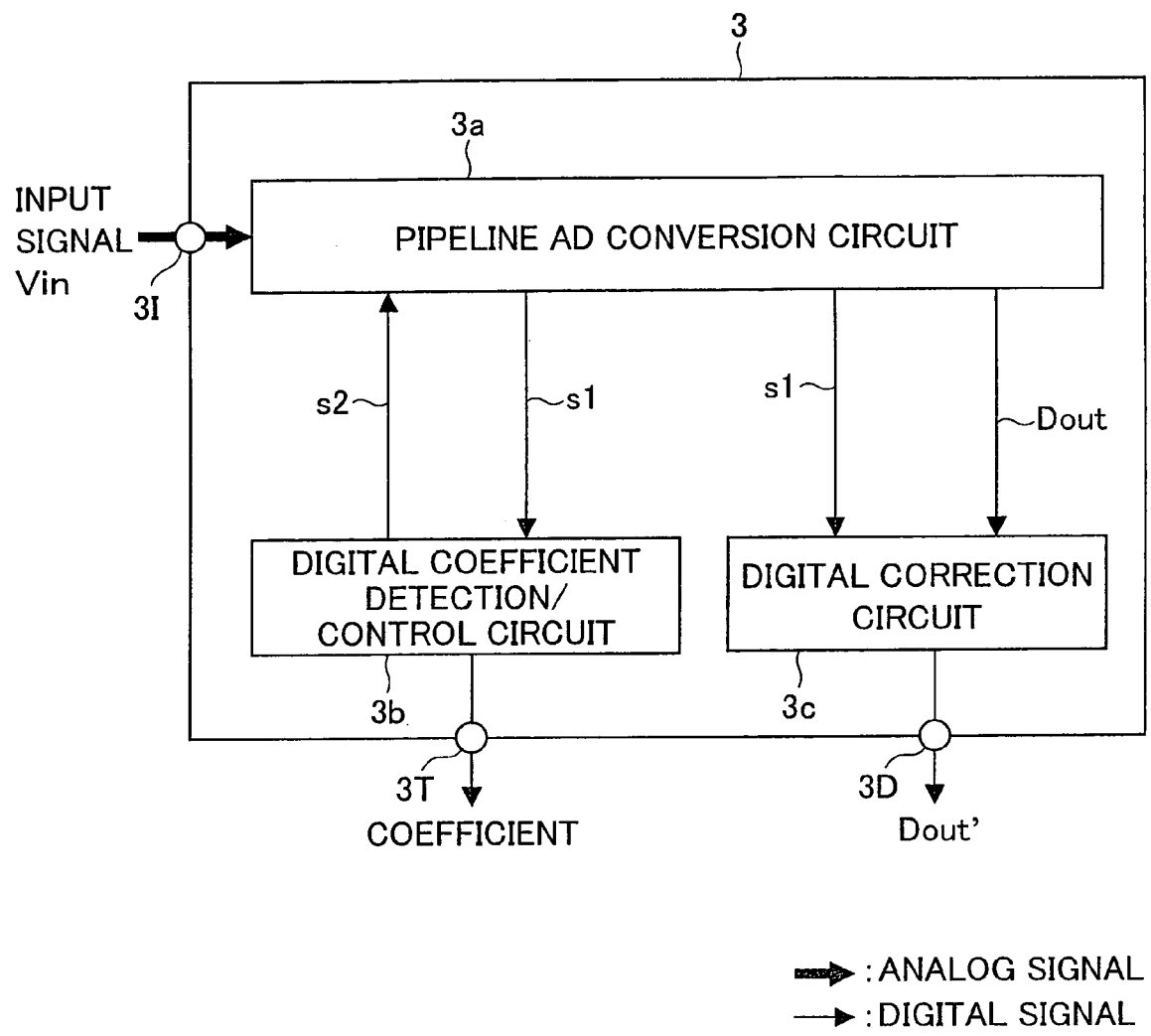
FIG. 3 is a block diagram illustrating a structure of a major part of a third electronic circuit apparatus of Embodiment 1 of the present invention.

FIG. 3 illustrates a structure of an AD conversion circuit equipped circuit 3 according to the present embodiment. The AD conversion circuit equipped circuit 3 is an IC, and constitutes a correction type AD conversion circuit. Specifically, the AD conversion circuit equipped circuit 3 includes a pipeline AD conversion circuit 3a, a coefficient detector/control circuit 3b, a digital correction circuit 3c, and an external output terminal 3T for sending a detected coefficient to the outside of the IC. The pipeline AD conversion circuit (circuit including analog circuits; AD conversion circuit) 3a receives an analog input signal Vin from an input terminal 3I of the IC, and carries out AD conversion with respect to the input signal Vin, and sends, to the correction circuit 3c, a digital output Dout obtained by the AD conversion. Further, the pipeline AD conversion circuit 3a sends a coefficient s1 to the coefficient detection/control circuit 3b and the digital correction circuit 3c. The coefficient s1 is indicative of a predetermined property of each of the analog circuits of the pipeline AD conversion circuit 3a. Note that a power source system terminal, a reference voltage system terminal, a clock terminal are omitted in FIG. 3.

The coefficient s1 is a value of a signal, and a digital signal. Note that a digital signal in the structure of FIG. 1 is not necessarily a 1-bit digital signal, but a digital signal that has a predetermined bit width and that is transmitted through a general bus. Further, the coefficient s1 may be serial data or parallel data. The pipeline AD conversion circuit 3a includes stages, and each of the stages except the last one includes an amplifier, whose property is regarded as the predetermined property of the analog circuit.

So, a property beneficial for the user can be found in accordance with the predetermined property targeted for the detection. Further, the coefficient detected by a below-mentioned coefficient detection circuit of the coefficient detection/control circuit 3b is sent from the external output terminal 3T to the outside of the IC. By monitoring the coefficient thus sent, the test for the quality judgment of the circuit can be carried out.

Further, the coefficient detection circuit (detection means) of the coefficient detection/control circuit processes and detects the coefficient s1 as a signal, with the result that the coefficient detection circuit detects the predetermined property of the analog circuit as a coefficient. The coefficient detection circuit may detect the predetermined property in accordance with (i) the digital value of the coefficient s1 or (ii) a value obtained by processing the digital value. Further, a control circuit (control means) of the coefficient detection/control circuit 3b generates a control signal s2 according to the detection result of the coefficient s1 and sends the control signal s2 to the pipeline AD conversion circuit 3a. The control signal s2 is a digital signal. In accordance with the control signal s2 the digital control circuit adjusts the operation state of the analog circuit so as to control the operation of the pipeline AD conversion circuit 3a.

In the AD conversion circuit equipped circuit 3 serving as the IC, the digital coefficient detection circuit of the digital coefficient detection/control circuit 3b can autonomously carry out the detection of the coefficient s1 and the digital control circuit of the digital coefficient detection/control circuit 3b can autonomously carry out the control. In this case, no instruction for the signal processing needs to be supplied from the outside of the IC.

In accordance with a result of the control, the pipeline AD conversion circuit 3a outputs the digital output Dout. The correction circuit (correction means) 3c corrects the digital output Dout in accordance with the coefficient s1 and sends a digital output Dout', which is obtained by correcting the Dout, to the outside of the IC via an output terminal 3D. When each of the uneven properties of the analog circuits of the pipeline AD conversion circuit 3a causes the input/output relation in the AD conversion to be undesirable, an AD conversion error occurs. However, the digital correction circuit 3c corrects such an AD conversion error.

The adjustment of the operation state of each of the analog circuits makes it possible that: (i) each of the predetermined properties is kept desirable so as not to, e.g., affect the value of the digital output Dout obtained in accordance with the input voltage Vin, and (ii) the pipeline AD conversion circuit 3a is controlled such that the analog circuit consumes electric power as small as possible. That is, even though the respective properties of the analog circuits are uneven, electric power consumption reduction can be attained according to each property of the analog circuits. Further, the aforementioned conventional analog circuit designing uses the circuit, which varies the parameter of the analog circuit and which is provided together with the analog circuit. The circuit is used such that the margin does not become excessively large. The circuit carries out the parameter setting so as to deal with (i) each of the uneven properties of the analog circuits to be manufactured, and (ii) various usage modes. However, each property of the analog circuits to be manufactured is not predictable when manufacturing each of the analog circuits. Thus, it is difficult to carry out appropriate parameter setting after the manufacturing. In contrast, the structure shown in FIG. 3 detects the property of the manufactured analog circuit, with the result that the manufactured analog circuit can be used with good accuracy.

As such, the structure shown in FIG. 3 finds the coefficient indicative of (i) each of the uneven predetermined properties of the analog circuits, and (ii) the operation state including the condition outside the analog circuit. The structure can control the pipeline AD conversion circuit by adjusting the operation state of the analog circuit in accordance with each predetermined property and the operation state thus found. This allows for (i) accuracy improvement whose realization is difficult merely by controlling the parameter of the analog circuit, and (ii) the current consumption reduction. Further, by monitoring the coefficient sent from the output terminal to the outside of the electronic circuit apparatus, the test for judging the quality of the electronic circuit apparatus can be easily carried out at a low cost.

Further, the AD conversion circuit of the structure shown in FIG. 3 is a pipeline AD conversion circuit, which is made up of a plurality of stages, and which is excellent in terms of balance of conversion speed, conversion accuracy, and current consumption. Therefore, the analog circuit of such a pipeline AD conversion circuit outputs a signal whose quality is good to some extent even before the correction, when the operation state adjustment is carried out in accordance with (i) the detected predetermined property of the analog circuit of the pipeline AD conversion circuit and (ii) the detected operation state including the outer condition. This allows reduction of load imposed on the digital correction circuit 3c.

Further, the digital coefficient detection/control circuit 3b in the structure shown in FIG. 3 is a circuit for (i) carrying out the digital processing of the coefficient s1 and (ii) carrying out digital processing so as to generate the control signal s2 in accordance with the detection result of the coefficient s2. Further, the digital correction circuit 3c is a digital processing circuit for (i) correcting, in accordance with the coefficient s1 the digital output Dout sent from the pipeline AD conversion circuit 3a, and (ii) accordingly outputting the digital output Dout'. Generally, an output of an AD conversion circuit such as the pipeline AD conversion circuit 3a has a digital value, so that the digital output value of the AD conversion circuit can be most effectively utilized by a digital circuit for processing the output sent from the AD conversion circuit. In this case, no additional analog circuit is required.

Note that each of the stages of the pipeline AD conversion circuit 3a except the last stage includes an amplifier serving as the analog circuit; however, stages targeted for the property detection and the operation state adjustment may be all the stages or be some of the stages.

Figure 4:
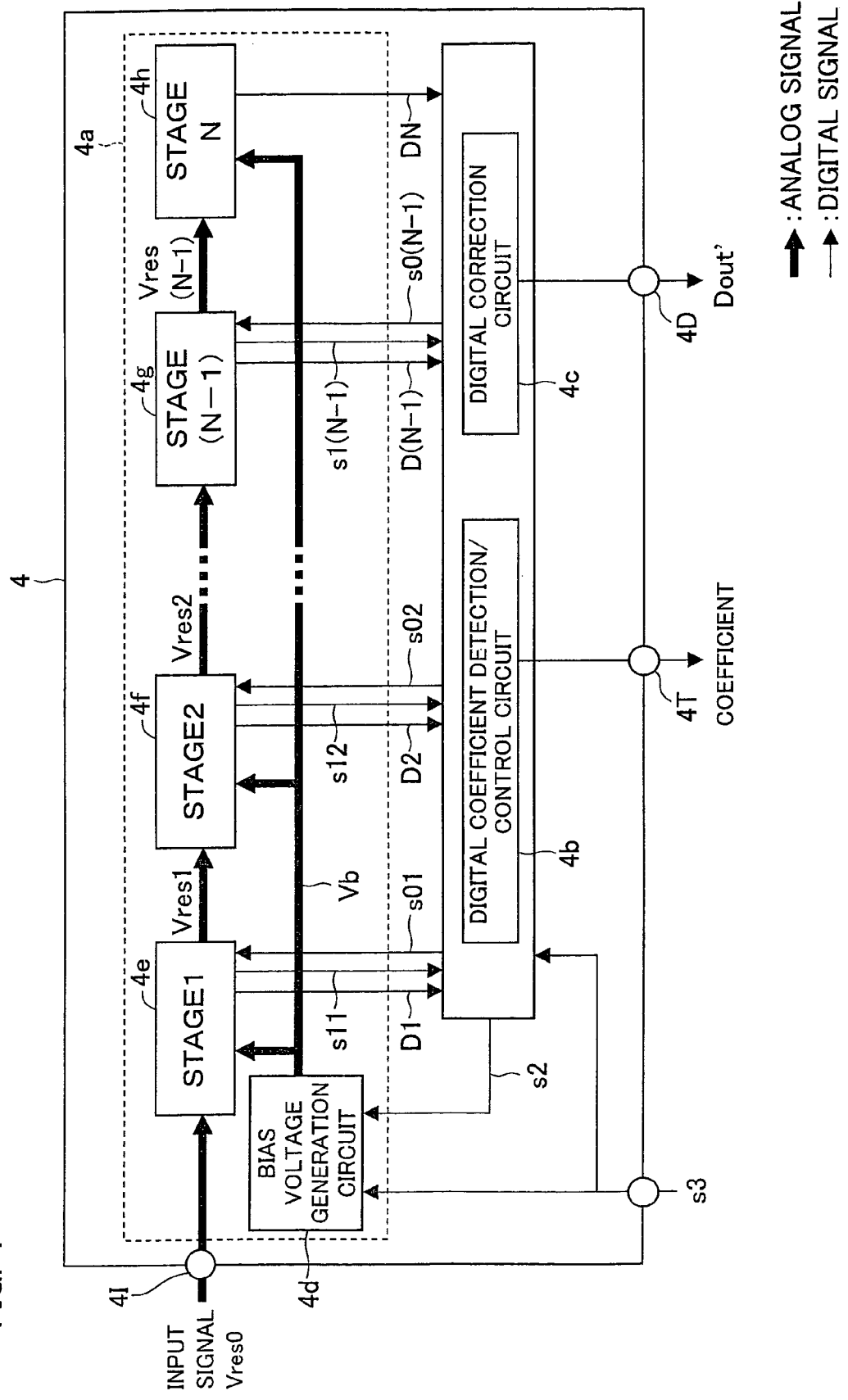
FIG. 4 is a block diagram illustrating a structure of a major part of a fourth electronic circuit apparatus of Embodiment 1 of the present invention.

FIG. 4 illustrates a structure of an AD conversion circuit equipped circuit 4 serving as an analog circuit equipped circuit (electronic circuit apparatus) according to the present embodiment. The AD conversion circuit equipped circuit 4 includes AD conversion circuits serving as analog circuits, and is an IC, and constitutes a correction type AD conversion circuit. Specifically, the AD conversion circuit equipped circuit 4 includes a pipeline AD conversion circuit 4a, a coefficient detector/control circuit 4b, a digital correction circuit 4c, and an external output terminal 4T for sending a detected coefficient to the outside of the IC. Note that a power source system terminal, a reference voltage system terminal, a clock terminal are omitted in FIG. 4.

Figure 11:
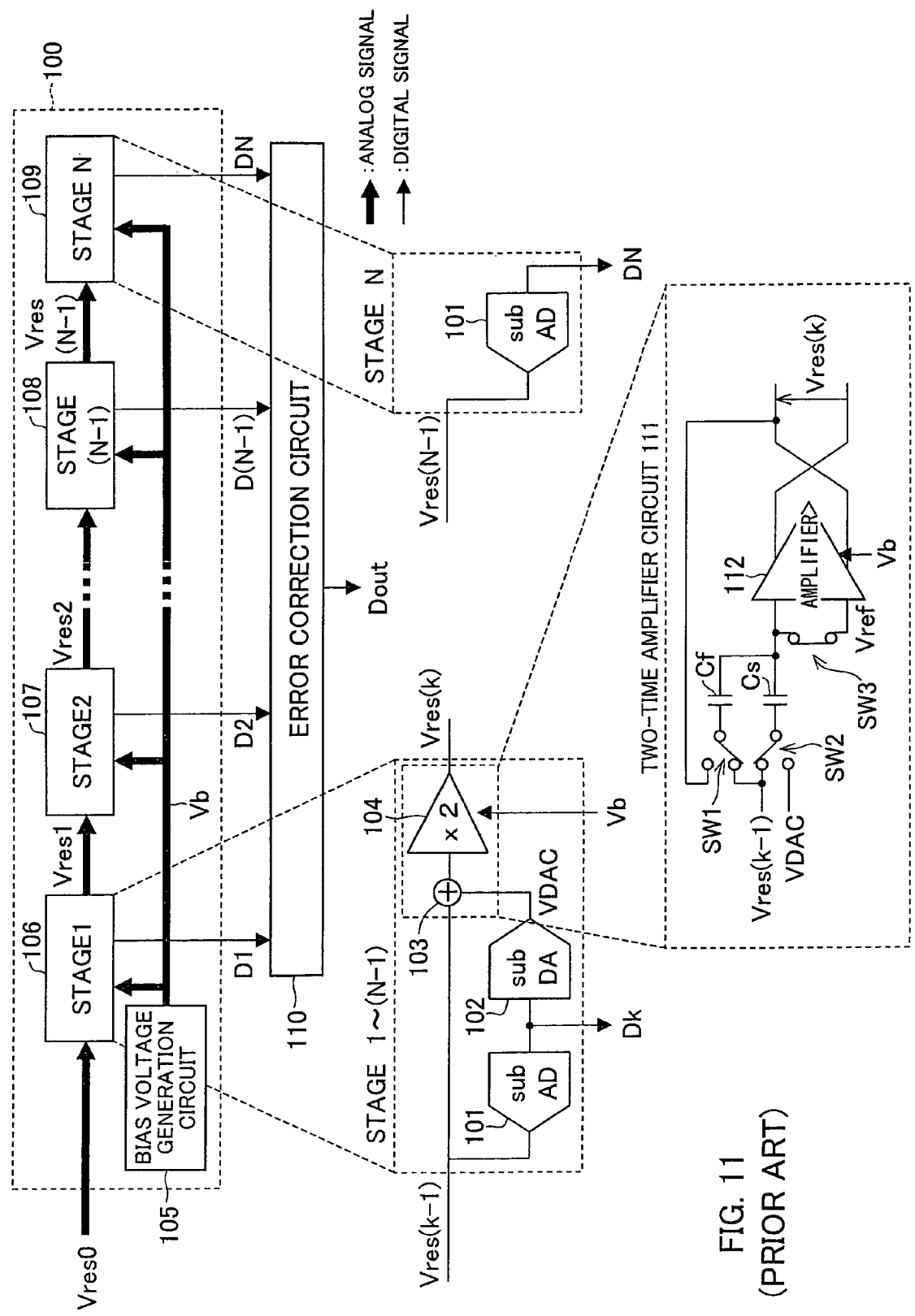
FIG. 11 is a block diagram illustrating a structure of a major part of a conventional electronic circuit apparatus.

The pipeline AD conversion circuit (circuit including analog circuits; AD conversion circuit) 4a includes the n-number of stages (STAGE 1 through STAGE N) 4e through 4h, and a bias voltage generation circuit 4d. The k-th one (k=1 through N−1; STAGE k) of the stages carries out AD conversion with respect to an analog input signal Vres(k−1), and sends, to the digital correction circuit 4c, a digital output Dk obtained by the conversion. Further, the k-th stage causes an amplifier serving as the analog circuit to amplify a differential between the input signal Vres(k−1) and a value obtained by carrying out DA conversion with respect to the digital output Dk. This allows acquirement of an analog signal Vrek, and the k-th stage sends the signal Vrek to a next stage. Further, the first stage (STAGE 1) 4e receives, via an input terminal 4I of the IC, an input signal Vres0 sent to the pipeline AD conversion circuit 4a. Further, the last stage (STAGE N) 4h receives an input signal Vres(N−1), and carries out AD conversion with respect to the input signal Vres(N−1), and sends, to the digital correction circuit 4c, a digital output DN obtained by the AD conversion. Each structure of the stages (STAGE 1 through STAGE N) 4e through 4h is basically the same as the structure explained above with reference to FIG. 11, so that the structure herein uses the two-time amplifier circuit 111 shown in FIG. 11, and the amplifier 112 shown in FIG. 11. The bias voltage generation circuit 4d generates a bias voltage Vb to be supplied to the amplifier 112 for amplifying the differential between the input signal Vres(k−1) and the value obtained by carrying out DA conversion with respect to the digital output Dk. The amplifier 112 is provided in the two-time amplifier circuit 111.

Further, the k-th stage (k=1 through N−1; STAGE K) receives a control signal s0k from the digital coefficient detection/control circuit 4b (described later), and sends a coefficient s1k to the digital coefficient detection/control circuit 4b and the digital correction circuit 4c in accordance with an instruction of the control signal s0k. The coefficient s1k is indicative of the predetermined property of the two-time amplifier circuit 111 serving as the analog circuit provided in each of the stages. At least one of (i) the stage corresponding to "k=1" through (ii) the stage corresponding to "k=N−1" may receive the control signal s0k, and may output the coefficient s1k; however, the following effect can be obtained in the case where each of (i) the stage corresponding to "k=1" through (ii) the stage corresponding to "k=N−1" receives the control signal s0k, and outputs the coefficient s1k as shown in FIG. 4. That is, even when any of the stages has the most undesirable predetermined property, the one having the most undesirable predetermined property can be detected and handled. Examples of such a predetermined property include: a gain of the two-time amplifier circuit 111, and a gain error, as described later. Further, general examples of such a predetermined property include: (i) a voltage in a predetermined location in the two-time amplifier circuit 111, (ii) a current in a predetermined location in the two-time amplifier circuit 111, and (ii) a value expressed by using the voltage or the current.

The coefficient s1k is a digital signal. Note that a digital signal in the structure of FIG. 4 is not necessarily a 1-bit digital signal, but a digital signal that has a predetermined bit width and that is transmitted through a general bus. Further, the coefficient s1k may be serial data or parallel data. The bias voltage generation circuit 4d changes (varies) the bias voltage Vb to be generated in accordance with the input control signal s2 and an input bias setting signal s3.

So, a property beneficial for the user can be found by a below-mentioned coefficient detection circuit of the coefficient detection/control circuit 4b, in accordance with the predetermined property targeted for the detection. Further, the coefficient detected by the coefficient detection circuit of the coefficient detection/control circuit 4b is sent from the external output terminal 4T to the outside of the IC. By monitoring the coefficient thus sent, the test for the quality judgment of the circuit can be carried out.

The coefficient detection circuit (detection means) of the coefficient detection/control circuit 4b processes and detects the coefficient s1k as a signal, with the result that the predetermined property of the analog circuit is detected as a coefficient. The coefficient detection circuit may detect the predetermined property in accordance with (i) the digital value of the coefficient s1 or (ii) a value obtained by processing the digital value. Further, a control circuit (control means) of the coefficient detection/control circuit 4b generates a control signal s2 according to the detection result of the coefficient s1 by way of digital processing, and sends the control signal s2 to the bias voltage generation circuit 4d of the pipeline AD conversion circuit 4a. The control signal s2 is a digital signal. In accordance with the control signal s2 the digital control circuit adjusts the operation state of the two-time amplifier circuit 111 so as to control the operation of the pipeline AD conversion circuit 4a.

Further, there may be another way of generating the signal for setting the bias voltage as follows, which signal is to be supplied to the bias voltage generation circuit 4d. That is, a bias voltage setting signal s3 is supplied from the outside of the AD conversion circuit equipped circuit 4 to the digital control circuit, and the digital control circuit generates the control signal s2 in accordance with the bias voltage setting signal s3 thus received, and sends the control signal s2 to the bias voltage generation circuit 4d. On this occasion, the bias voltage setting signal s3 is also directly sent to the bias voltage generation circuit 4d, and the bias voltage setting signal s3 thus directly sent causes the bias voltage generation circuit 4d to be operable.

In the AD conversion circuit equipped circuit 4 serving as the IC, the digital coefficient detection circuit of the digital coefficient detection/control circuit 4b can autonomously carry out the detection of the coefficient s1k, and the digital control circuit of the digital coefficient detection/control circuit 4b can autonomously carry out the control. In this case, no instruction for the signal processing needs to be supplied from the outside of the IC.

In accordance with a result of the control, the pipeline AD conversion circuit 4a outputs a digital output Dout made up of digital outputs D1 through DN. The correction circuit (correction means) 4c corrects the digital output Dout in accordance with the coefficient s1k, and sends a digital Dout', which is obtained by correcting the digital output Dout, to the outside of the IC via an output terminal 4D. When each of the uneven properties of the analog circuits of the pipeline AD conversion circuit 4a causes the input/output relation in the AD conversion to be undesirable, an AD conversion error occurs. However, the digital correction circuit 4c corrects such an AD conversion error.

As explained above with reference to FIG. 11 through FIG. 13, the current flowing through the amplifier 112 is changed by varying the bias voltage Vb to be supplied from the bias voltage generation circuit 4d to the amplifier 112 of each stage. Such a change of the current flowing through the MOS transistor constituting the amplifier 112 causes the change of the settling time of the output voltage Vout of the two-time amplifier circuit 111, as explained above with reference to FIG. 13. Now, see the case where the output voltage Vout is settled down to the predetermined voltage V1 in the predetermined time t1. In this case, the current corresponding to the curved line c4 shown in FIG. 13 is the smallest current for settling the output voltage Vout to the predetermined voltage V1 in the predetermined time t1, because the current corresponding to the curved line c4 causes the output voltage Vout to be settled down to the predetermined voltage V1 precisely on the predetermined time t1. Therefore, in order to find a condition under which the output voltage Vout is settled down to the predetermined voltage V1 in the manner illustrated by the curved line c4, the structure shown in FIG. 4 examines how the settling behavior of the output voltage Vout of the two-time amplifier circuit 111 is changed by varying the bias voltage Vb to be supplied to the amplifier 112. See the curved lines c1 through c5 in FIG. 13, as examples of the examination of the settling behavior change.

Figure 5:
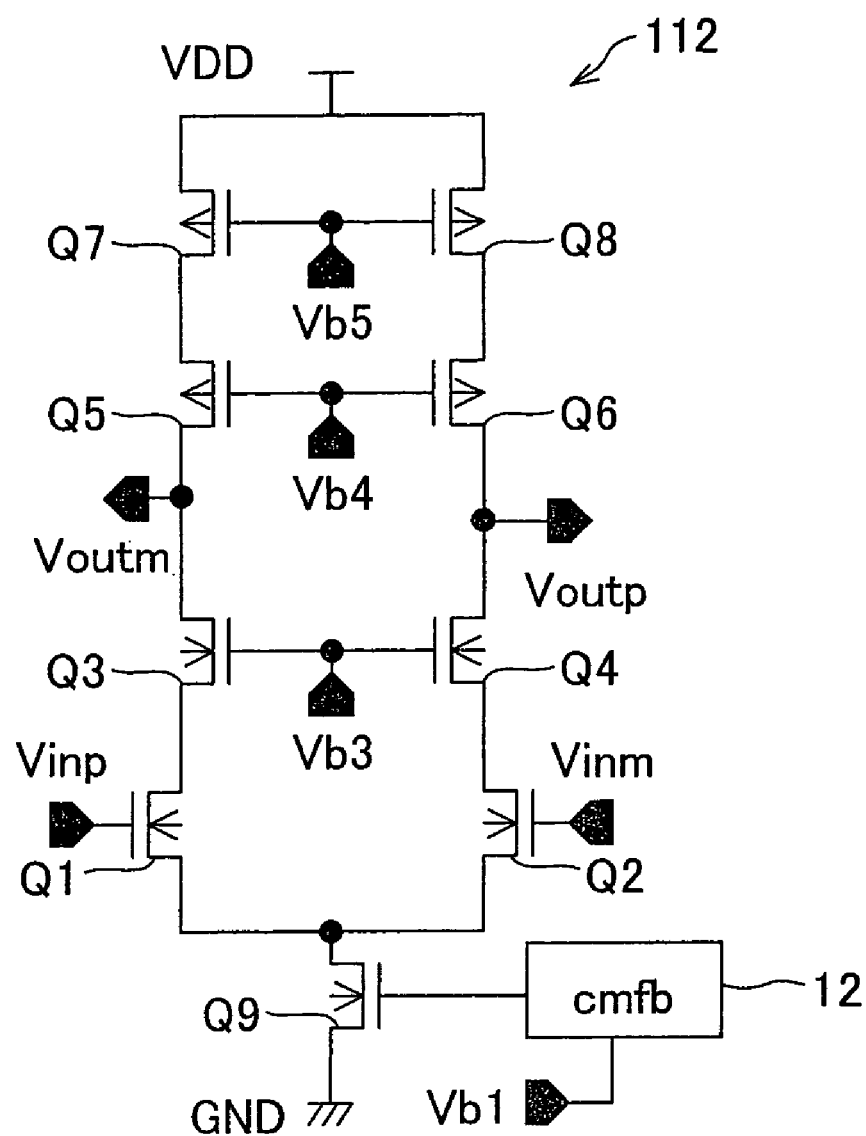
FIG. 5 is a circuit block diagram illustrating a structure of an amplifier provided in the electronic circuit apparatus shown in FIG. 4.

The following explains respective structure examples of (i) the amplifier 112 provided in the two-time amplifier circuit 111 of each stage, and (ii) the bias voltage generation circuit 4d. Note that, these are just examples. See FIG. 5 illustrating the amplifier 112. The amplifier 112 is provided in each of the stages, and is a telescopic amplifier. The amplifier 112 includes transistors Q1 through Q9, and a common mode feedback circuit 12. The transistors Q1 through Q4 and Q9 are N-channel MOS transistors. Meanwhile, the transistors Q5 through Q8 are P-channel MOS transistors.

The transistor Q1 has a source connected to the source of the transistor Q2, and the respective sources of transistors Q1 and Q2 are connected to the drain of the transistor Q9. The transistor Q9 has a source connected to GND. The transistor Q1 has a drain connected to the source of the transistor Q3. The transistor Q2 has a drain connected to the source of the transistor Q4. The transistor Q3 has a gate connected to the source of the transistor Q3. The transistor Q3 has a gate connected to the gate of the transistor Q4. The transistor Q3 has a drain connected to the drain of the transistor Q5. The transistor Q4 has a drain connected to the drain of the transistor Q6. The transistor Q5 has a gate connected to the gate of the transistor Q6. The transistor Q6 has a source connected to the drain of the transistor Q7, and to the drain of the transistor Q8. The source of the transistor Q7, and the source of the transistor Q8 are connected to a power source VDD. The transistor Q7 has a gate connected to the gate of the transistor Q8.

The amplifier 112 has a differential input structure in which: the gate of the transistor Q2 receives an input voltage Vinm, and the gate of the transistor Q2 receives another input voltage Vinp. Further, the amplifier 112 has a differential output structure in which: one output voltage Voutm is sent from the node of (i) the drain of the transistor Q3 and (ii) the drain of the transistor Q5, and the other output voltage Voutp is sent from the node of (i) the drain of the transistor Q4 and (ii) the drain of the transistor Q6.

Further, the gate of the transistor Q9 is connected to the common mode feedback circuit 12, and a bias voltage Vb1 is applied to the common mode feedback circuit 12. In accordance with the bias voltage Vb1, the common mode feedback circuit 12 determines a common voltage of a differential signal. Further, a bias voltage Vb4 is applied to the respective gates of the transistor Q5 and the transistor Q6. Further, a bias voltage Vb5 is applied to the respective gates of the transistor Q7 and the transistor Q8. The bias voltages Vb1, Vb3, Vb4, and Vb5 are applied from the bias voltage generation circuit 4d. As is the case with the input voltage, explained with reference to FIG. 11, of the amplifier 112, the input voltages Vinm and Vinp are generated by using the bias voltage Vb2 sent from the bias voltage generation circuit 4d, and are voltages on the order of the bias voltage Vb2.

Figure 6:
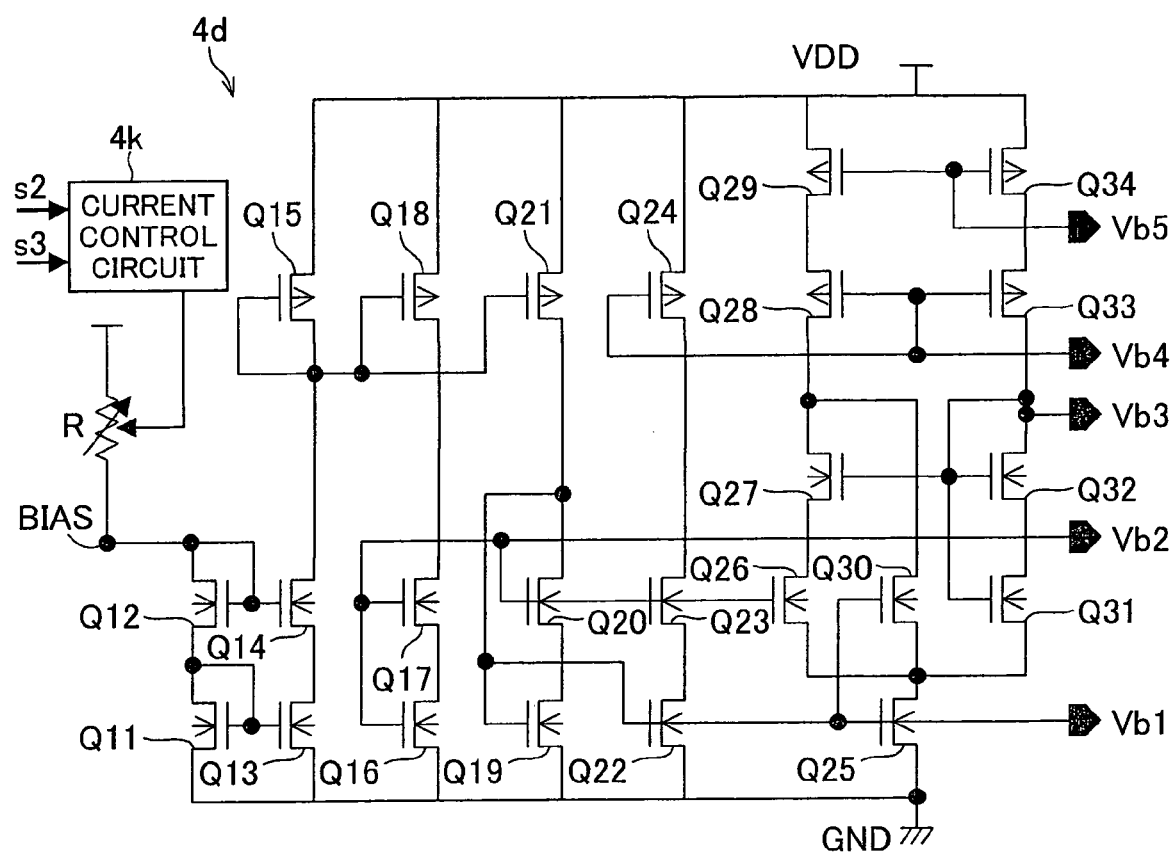
FIG. 6 is a circuit diagram illustrating a first example of a bias voltage generation circuit provided in the electronic circuit apparatus shown in FIG. 4.

Next, FIG. 6 illustrates a structure example of the bias voltage generation circuit 4d. The bias voltage generation circuit 4d includes a current control circuit 4k, a resistor R, and transistors Q1 through Q34. The transistors Q11 through Q14, Q16, Q17, Q19, Q20, Q22, Q23, Q25 through Q27, and Q30 through Q32 are N-channel MOS transistors, respectively. Meanwhile, the transistors Q15, Q18, Q21, Q24, Q28, Q29, Q33, and Q34 are P-channel MOS transistors, respectively.

The resistor R pulls up a bias voltage control terminal BIAS of the bias voltage generation circuit 4d to a power source. This allows simultaneous change of the bias voltages Vb1 through Vb5 outputted in accordance with the current flowing through the resistor R. Specifically, the current control circuit 4k changes a resistance of the resistor R in accordance with the input control signal s2 and/or the bias voltage setting signal s3. This causes change of the current flowing through the resistor R. The transistor Q11 has a source connected to GND. The drain of the transistor Q11 and the source of the transistor Q12 are connected to each other. The transistor Q12 has a drain connected to the bias voltage control terminal BIAS. The transistor Q13 has a source connected to GND. The gate and drain of the transistor Q11 are connected to the gate of the transistor Q13. The gate and drain of the transistor Q12 are connected to the gate of the transistor Q14. The drain of the transistor Q14 and the drain of the transistor Q15 are connected to each other. The transistor Q15 has a source connected to the power source VDD.

The transistor Q16 has a source connected to GND. The drain of the transistor Q16 and the source of the transistor Q17 are connected to each other. The drain of the transistor Q17 and the drain of the transistor Q18 are connected to each other. The source of the transistor Q18 is connected to the power source VDD.

The transistor Q19 has a source connected to GND. The drain of the transistor Q19 and the source of the transistor Q20 are connected to each other. The drain of the transistor Q20 and the drain of the transistor Q21 are connected to each other. The transistor Q21 has a source connected to the power source VDD.

The gate of the transistor Q15, the gate of the transistor Q18, the gate of the transistor Q21 are connected to one another.

The transistor Q22 has a source connected to GND. The drain of the transistor Q22 and the source of the transistor Q23 are connected to each other. The drain of the transistor Q23 and the drain of the transistor Q24 are connected to each other. The transistor Q24 has a source connected to the power source VDD.

The transistor Q25 has a source connected to GND. The drain of the transistor Q25, the source of the transistor Q26, the source of the transistor Q30, and the source of the transistor Q31 are connected to one another.

The gate of the transistor Q19, the drain of the transistor Q20, the gate of the transistor Q22, the gate of the transistor Q25, and the gate of the transistor Q30 are connected to one another, and their node has a voltage, which is outputted as the bias voltage Vb1.

The gate of the transistor Q16, the gate of the transistor Q17, the gate of the transistor Q20, the gate of the transistor Q23, and the gate of the transistor Q26 are connected to one another, and their node has a voltage, which is outputted as the bias voltage Vb2.

The drain of the transistor Q26, and the source of the transistor Q27 are connected to each other. The drain of the transistor Q30, the drain of the transistor Q27, the drain of the transistor Q28 are connected to one another. The drain of the transistor Q31, and the source of the transistor Q32 are connected to each other. The gate of the transistor Q27, the gate of the transistor Q31, the gate of the transistor Q32, the drain of the transistor Q32, and the source of the transistor Q33 are connected to one another, and their node has a voltage, which is outputted as the bias voltage Vb3.

The gate of the transistor Q24, the gate of the transistor Q28, the gate of the transistor Q33 are connected to one another, and their node has a voltage, which is outputted as the bias voltage Vb4.

The source of the transistor Q28, and the drain of the transistor Q29 are connected to each other. The transistor Q29 has a source connected to the power source VDD. The source of the transistor Q33 and the drain of the transistor Q34 are connected to each other. The transistor Q34 has a source connected to the power source VDD. The gate of the transistor Q29 and the gate of the transistor Q34 are connected to each other, and their node has a voltage, which is outputted as the bias voltage Vb5.

The bias voltage generation circuit 4d thus arranged is such a circuit that acquires the analog outputs, i.e., the bias voltages Vb1 through Vb5 in accordance with the analog input, i.e., the current flowing through the transistor R. The current flowing through the resistor R is determined in accordance with the control signal s2 sent from the digital control circuit. Further, the bias voltage generation circuit 4d is arranged such that the current can be arbitrarily determined in accordance with the bias voltage setting signal s3 sent from the outside. Further, the bias voltage generation circuit 4d may be constituted by DA conversion circuits as shown in FIG. 7.

Figure 7:
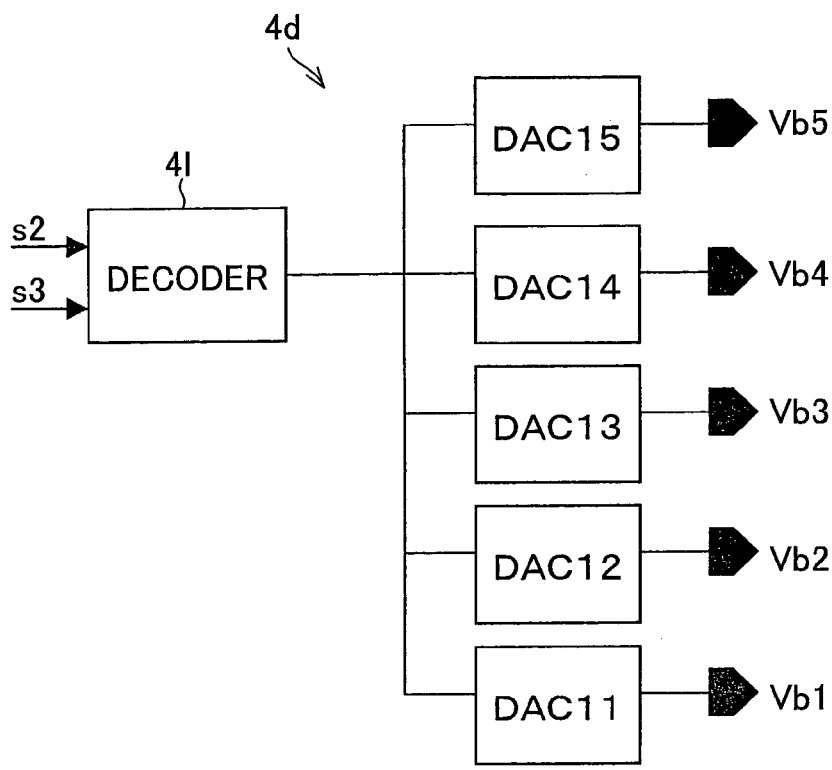
FIG. 7 is a circuit diagram illustrating a second example of the bias voltage generation circuit provided in the electronic circuit apparatus shown in FIG. 4.

The bias voltage generation circuit 4d shown in FIG. 7 is so arranged as to use a decoder 41 for the purpose of converting (i) the control signal s2 or the control signal s2 sent in the case of using the bias voltage setting signal s3, into (ii) a digital control signal appropriate for sending to DA converters. By changing the digital signal to be sent to the DA converters, each of the analog bias voltages to be generated can be changed. As such, the bias voltage can be controlled efficiently with the use of the digital signal obtained by processing the coefficient s1k, which has a digital value and which is sent from the pipeline AD conversion circuit 4a. Note that the number of the DA converters thus provided may correspond to the number of the bias voltages Vb. For example, in cases where the amplifiers of the stages respectively use the five bias voltages Vb as shown in FIG. 5, DA converters DAC11 through DAC 15 may be so provided as to correspond to the bias voltages Vb1 through Vb5, respectively. In this way, the bias voltage generation circuit 4d uses the DA converters so as to individually change the bias voltages Vb. This allows generation of the bias voltages Vb whose number corresponds to the number of the amplifiers to be used. With this, the generation of the bias voltages Vb can be carried out efficiently.

Figure 8:
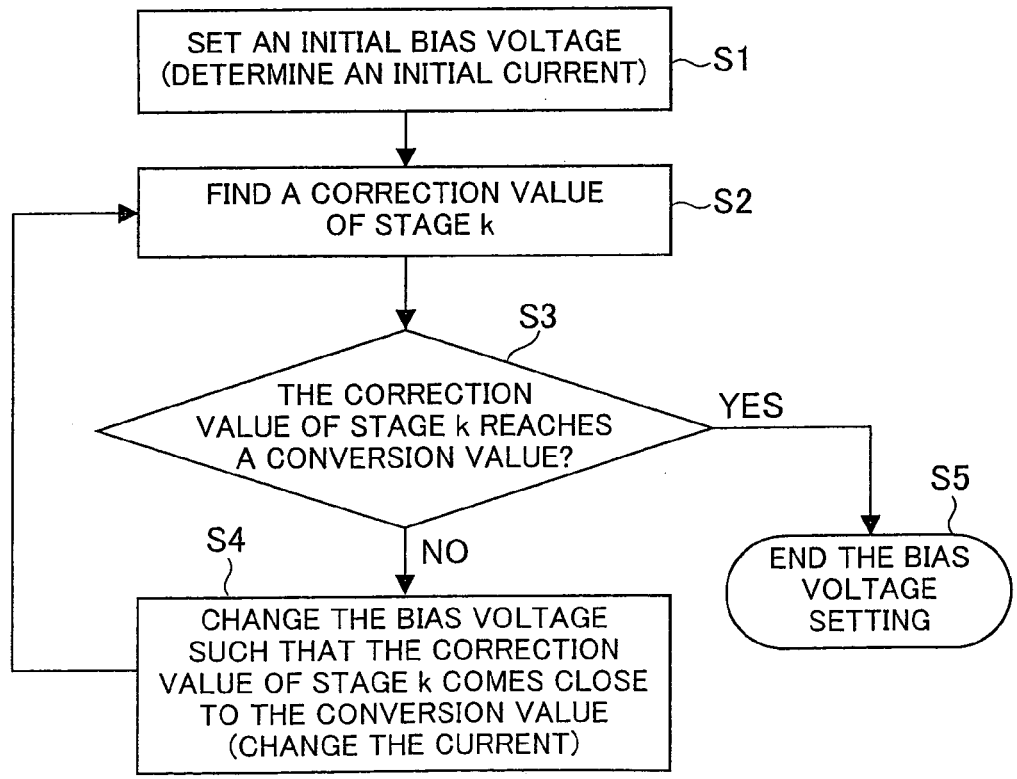
FIG. 8 is a flowchart illustrating a flow of bias voltage setting carried out by the electronic circuit apparatus shown in FIG. 4.

Next, FIG. 8 illustrate flow of setting each of the bias voltages Vb to be applied to each of the stages. In S1 (step 1), an initial bias voltage Vb is set so as to determine an initial current to be supplied to the amplifier 112. In S2, the digital coefficient detection/control circuit 4b detects the coefficient s1k which corresponds to the bias voltage Vb, and which is sent from the stage. In other words, in S2, the digital coefficient detection/control circuit 4b detects the property of the two-time amplifier circuit 111 of the pipeline AD conversion circuit 4a. A specific example of the property is a gain of the two-time amplifier circuit 111. The gain, obtained as a result of the setting of the bias voltage Vb, of the two-time amplifier circuit 111 is termed "correction value". A way of finding the gain of the two-time amplifier circuit 111 will be fully explained later. In S3, judgment is carried out whether or not the correction value reaches a convergence value. In cases where the correction value is not converged in S3, the control signal s2 according to the result of detecting the coefficient s1k is generated so as to change the bias voltage Vb such that the correction value comes close to the convergence value. This causes change of the current in the amplifier 111, and the sequence goes back to S2. In S2, the correction value is found again in accordance with the newly obtained bias voltage Vb, and the sequence goes to S3. In cases where the correction value reaches the convergence value in S3, the sequence goes to S5, with the result that the setting of the bias voltage Vb is finished. Such an operation is repeated until the correction value is converged to the predetermined convergence value. This covers an error that suddenly occurs, so that the most appropriate bias voltage Vb can be obtained.

Here, the judgment whether or not the correction value reaches the convergence value is carried out, for example, as follows. See FIG. 13, assuming that an initial settling behavior corresponds to the curved line c1. In this case, there is room for reducing the current flowing through the amplifier, so that current reduction is gradually carried out. The judgment is carried out by judging whether or not the current reduction caused the settling behavior to coincide with the settling behavior which corresponds to the curved line c4, and in which the output voltage Vout is settled down to the predetermined voltage V1 precisely on the predetermined time t1. Specifically, the output voltage Vout settles down to the predetermined voltage V1 in the predetermined time t1, when the current is reduced to a level falling within a range from (i) the current corresponding to the curved line c1, to (ii) the current corresponding to the curved line c4. However, when the current is reduced to a level exceeding the current corresponding to the curved line c4, the output voltage Vout is not settled down to the predetermined voltage V1 in the predetermined time t1 as illustrated by the curved line c5. In this case, the current is increased again until finding the condition under which the current supply causes the settling behavior to coincide with the settling behavior corresponding to the curved line c4, i.e., until finding the condition of the bias voltage Vb. When the condition is thus found, it is judged that the correction value reaches the convergence value.

Further, see an example in which the initial settling behavior corresponds to the curved line c5. Required in this case is increase of the current to be supplied to the amplifier. Also in this case, the judgment is carried out whether or not the current supply causes the settling behavior to coincide with the settling behavior which corresponds to the curved line c4 and in which the output voltage Vout is settled down to the predetermined voltage V1 precisely on the predetermined time t1. While the current is increased from the curved line c5 to the curved line c4, the correction value keeps on changing; however, the correction value in the curved line c4 should be the same as each of the correction values in the curved lines c1, c2, and c3. Therefore, it is judged that the correction value reaches the convergence value, when the condition is found under which the current supply causes the settling behavior to coincide with the settling behavior corresponding to the curved line c4, i.e., when the condition of the bias voltage Vb is found.

For this reason, as shown in the flowchart of FIG. 8, the step of changing the correction value is repeated several times. This makes it possible to set the bias voltage Vb such that the minimally required current flows through the amplifier. Accordingly, the current consumption can be restrained.

In cases where the value, obtained by processing the value of the digital signal sent from the AD conversion circuit, is used for the coefficient indicative of the property of the AD conversion circuit serving as the analog circuit, the gain and gain error of the stage can be used as the property of the two-time amplifier circuit 111. Therefore, in the structure shown in FIG. 4, the coefficient s1k may be indicative of the gain or the gain error. Alternatively, the coefficient s1k may be so processed and so calculated by the digital coefficient detection/control circuit 4b as to be a coefficient indicative of the gain or the gain error. In cases where the gain is used as the coefficient that the digital coefficient detection/control circuit 4b finally detects as the property of the two-amplifier circuit 111, it is appropriate that the convergence value is set at 2 or a value very close to 2. On the other hand, in cases where the gain error is used as the coefficient, it is appropriate that the convergence value is set at 0. In the first place, a circuit for finding such a gain or such a gain error is provided in the structure for correcting the AD conversion result Dk such as the AD conversion circuit equipped circuit 4. Specifically speaking, in the AD conversion circuit equipped circuit 4, such a circuit for finding the gain or the gain error is provided in the digital coefficient detection/control circuit 4b. Therefore, no new circuit needs to be provided for the generation of the coefficient indicative of the gain or the gain error. Note that, a pipeline AD conversion circuit possibly has a gain corresponding to the number of digital outputs of stages, so that the gain is possibly not 2 but, e.g., 4 or 8. The present application is applicable to such cases.

In cases where the gain representing 2 or the value very close to 2 is used for the coefficient, the external output terminal 4T outputs the signal representing 2 or a value very close to 2. This output signal of the external output terminal 4T is used for the quality judgment. That is, when the output signal is not indicative of 2 or the value very close to 2, malfunction is suspected in the pipeline AD conversion circuit 4a, the digital coefficient detection/control circuit 4b, or the digital correction circuit 4c. On the other hand, in cases where the gain error is used for the coefficient, the external output terminal 4T outputs the signal representing a value very close to 0. When the value of this output signal of the external output terminal 4T is greatly different from the value, malfunction is suspected in the pipeline AD conversion circuit 4a, the digital coefficient detection/control circuit 4b, or the digital correction circuit 4c. Note that, a pipeline AD conversion circuit possibly has a gain corresponding to the number of digital outputs of stages, so that the gain is possibly not 2 but, e.g., 4 or 8. The present application is applicable to such cases.

Note that, the description here assumes the case where the gain or the gain error is used for the coefficient (correction value) that the digital coefficient detection/control circuit 4b finally recognizes as the property of the two-time amplifier circuit 111; however, the present invention is not limited to this, and a gain index or gain error index may be used for the coefficient. The gain index encompasses a function of the gain and a calculation result thereof. The gain error index encompasses a function of the gain error and a calculation result thereof.

Non-patent document 2 fully describes one example of the method for finding the gain of the two-time amplifier circuit 111 of the stage, so that only summary thereof will be explained below with reference to FIG. 4 and FIG. 12. Assume that the input/output property shown in FIG. 12(b) corresponds to the input/output property of the amplifier of the k-th stage (STAGE K). The analog input value Vres(k−1) indicative of 0 is sent thereto, but the digital value D to be sent to the sub DA converter of the stage is externally forced to be indicative of 0 or 1. When the digital value is 0, the analog output value Vres(k) corresponds to "OUT1" in FIG. 12(b). On the other hand, when the digital value is 1, the analog output value Vres(k) corresponds to "OUT2" in FIG. 12(b). The gain of the two-time amplifier circuit 111 of the stage is found by a difference between OUT1 and OUT2 (OUT1−OUT2). In an ideal case, the gain thus found is 2; however, in an actually manufactured device, the gain is mostly 2 or less. Alternatively, Non-patent document 3 uses two types of analog input value Vres(k−1) for the sake of acquiring two types of gain. Each of the two types of gain is found by calculation similar to the aforementioned calculation "OUT1−OUT2". The coefficient s1k may be indicative of a value found by "OUT1−OUT2" and is sent to the digital coefficient detection/control circuit 4b. Alternatively, the coefficient sk1 may be indicative of "OUT1" or "OUT2", and the coefficient sk1 indicative of "OUT1" and the coefficient sk1 indicative of "OUT2" are sequentially sent to the digital coefficient detection/control circuit 4b, and the digital coefficient detection/control circuit 4b carries out the calculation "OUT1−OUT2".

Further, the following explains a case of changing the current to be supplied to the two-time amplifier circuit 111 of each stage of the pipeline AD conversion circuit 4a, in an application whose conversion speed is variable. A specific example of such a case is a case where the current is reduced such that the pipeline AD conversion circuit 4a operates slowly. In this case, the bias voltage setting signal s3 is supplied from the outside to the digital coefficient detection/control circuit 4b as shown in FIG. 4 such that the digital coefficient detection/control circuit 4b operates. Thereafter, a new bias voltage Vb is set in accordance with the conversion processing flow shown in FIG. 8, with the result that the current to be supplied to the amplifier is adjusted. On this occasion, the bias voltage setting signal s3 is directly sent to the bias voltage generation circuit 4d, with the result that the bias voltage generation circuit 4d becomes operable. With this, an optimum current setting is carried out such that the electric power consumption is low in both (i) the case where the output voltage Vout is required to reach the predetermined voltage V1 in the predetermined time t1 as shown in FIG. 13, and (ii) the case where the output voltage Vout is required to reach the predetermined voltage V1 in the predetermined time t2. Further, this makes it possible that the digital coefficient detection/control circuit 4b and the bias voltage generation circuit 4d become operable only when the bias voltage Vb needs to be set again. Accordingly, the electric power consumption can be reduced.

As described above, the AD conversion circuit equipped circuit 4 can change the bias voltage Vb to be applied to the amplifier, in order to determine the bias voltage Vb. This makes it possible that the most appropriate bias voltage Vb is always applied to the amplifier. Further, the coefficient obtained on this occasion can be monitored via the external output terminal 4T. Therefore, intervention to the autonomous current control system can be carried out as required, by controlling, from the outside of the IC, the bias voltage setting signal s3. Such intervention can be carried out because the bias voltage generation circuit 4d is not necessarily required to use the bias voltage control signal corresponding to the monitored coefficient. Therefore, in some cases, a control signal may be intentionally used which allows application of a voltage lower or higher than the bias voltage corresponding to the coefficient thus obtained. Such voltage application from the outside causes the bias voltage to fall out of a range in a prepared table of combination of the predetermined coefficient and the bias voltage control signal. In this way, the intervention is carried out with respect to the autonomous current control system.

In the structure shown in FIG. 4, the adjustment of the operation state of each of the two-time amplifier circuits 111 serving as the analog circuits makes it possible that (i) each of the predetermined properties is kept desirable so as not to, e.g., affect the value of the digital output Dout obtained in accordance with the input voltage Vin, and (ii) the pipeline AD conversion circuit 4a is controlled such that the two-time amplifier circuit 111 consumes electric power as small as possible. That is, even though the respective properties of the analog circuits are uneven, electric power consumption reduction can be attained according to each property of the two-time amplifier circuits 111. Further, the aforementioned conventional analog circuit designing of the amplifier 112 uses the circuit, which varies the parameter of the amplifier 112 and which is provided together with the amplifier 112. The circuit is used such that the margin does not become excessively large, and the circuit carries out the parameter setting so as to deal with (i) each of the uneven properties of the amplifiers 112 to be manufactured, and (ii) various usage modes. However, each property of the analog circuits to be manufactured is not predictable when manufacturing each of the analog circuits. Thus, it is difficult to carry out appropriate parameter setting after the manufacturing. In contrast, the structure shown in FIG. 4 automatically detects the property of the manufactured analog circuit, or detects the property in accordance with the instruction sent as required. With this, the manufactured two-time amplifier circuit 111 does not have a margin more than necessary, and can be used with good accuracy.

As such, the structure shown in FIG. 4 finds the coefficient indicative of (i) each of the uneven predetermined properties of the two-time amplifier circuit 111, and (ii) the operation state including the condition outside the two-time amplifier circuit 111. Further, the structure can control the pipeline AD conversion circuit by adjusting the operation state of the two-time amplifier circuit in accordance with the found property and the found operation state including the condition outside the two-time amplifier circuit 111. This allows for (i) accuracy improvement whose realization is difficult merely by controlling the parameter of the amplifier 112, and (ii) the current consumption reduction. This allows realization of an AD conversion circuit equipped circuit (electronic circuit apparatus), which is capable of using the manufactured two-time amplifier circuit 111 with good accuracy, and which is capable of reducing (i) the electric power consumption of the amplifier 112 and (ii) a circuit scale thereof.

Further, the AD conversion circuit of the structure shown in FIG. 4 is a pipeline AD conversion circuit, which is made up of a plurality of stages, and which is excellent in terms of balance of conversion speed, conversion accuracy, and current consumption. Therefore, the two-time amplifier circuit 111 of such a pipeline AD conversion circuit outputs a signal whose quality is good to some extent even before the correction, when the operation state adjustment is carried out in accordance with (i) the detected predetermined property of the two-time amplifier circuit 111 of the pipeline AD conversion circuit and (ii) the detected operation state including the outer condition. This allows reduction of load imposed on the digital correction circuit 4c.

Further, the digital coefficient detection/control circuit 4b in the structure shown in FIG. 4 is a circuit for (i) carrying out the digital processing of the coefficient s1k, and (ii) carrying out digital processing so as to generate the control signal s2 in accordance with the detection result of the coefficient s1k. Further, the digital correction circuit 4c is a digital processing circuit for (i) correcting, in accordance with the coefficient s1k, the digital output Dout sent from the pipeline AD conversion circuit 4a, and (ii) accordingly outputting the digital output Dout'. Generally, an output of an AD conversion circuit such as the pipeline AD conversion circuit 4a has a digital value, so that the digital output value of the AD conversion circuit can be most effectively utilized by a digital circuit for processing the output sent from the AD conversion circuit. In this case, no additional analog circuit is required.

Further, by monitoring the coefficient sent from the external output terminal to the outside of the electronic circuit apparatus, the test for judging the quality of the electronic circuit apparatus can be easily carried out at a low cost.

Note that each of the stages of the pipeline AD conversion circuit 4a except the last stage includes the two-time amplifier circuit 111 as the analog circuit; however, the property detection and the operation state adjustment may be carried out with respect to all the stages or some of the stages.

[Embodiment 2]

Figure 9:
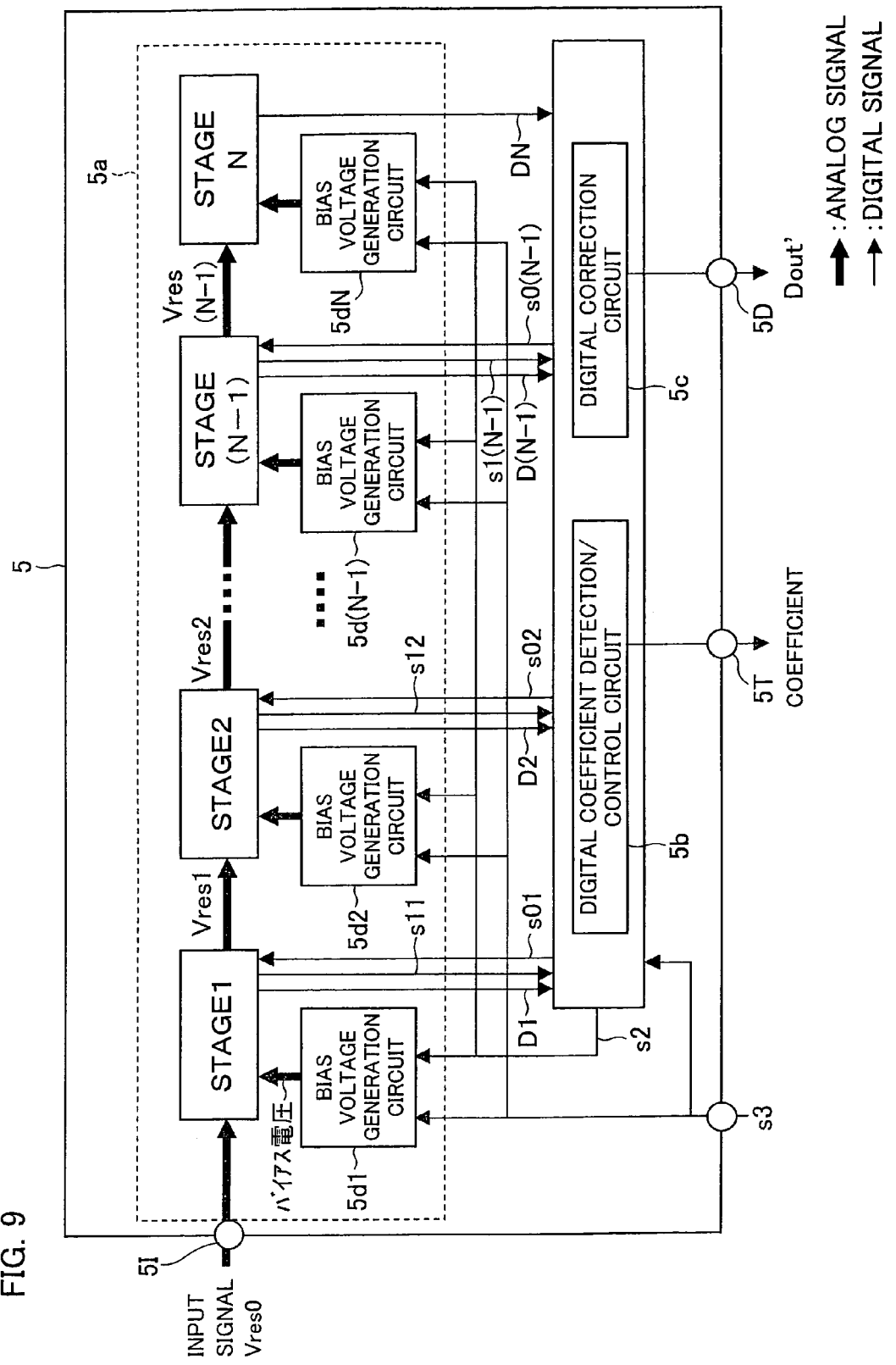
FIG. 9 is a block diagram illustrating a structure of a major part of an electronic circuit apparatus of Embodiment 2 of the present invention.

FIG. 9 illustrates a structure of an AD conversion circuit equipped circuit (electronic circuit apparatus) 5 according to the present embodiment. The AD conversion circuit equipped circuit 5 constitutes a correction type AD conversion circuit. Specifically, the AD conversion circuit equipped circuit 5 includes a plurality of the bias voltage generation circuits 4d, each of which is the same as the bias voltage generation circuit 4d of the AD conversion circuit equipped circuit 4 (see FIG. 4) of Embodiment 1. The bias voltage generation circuits 4d are so provided as to respectively correspond to (i) the first stage of the pipeline AD conversion circuit 4a, through (ii) the (N−1)-th stage thereof. This makes it possible to set an appropriate bias voltage Vb for each of the stages. Each of the bias voltage generation circuits 4d used here is hereinafter referred to as "bias voltage generation circuit 5dk (k=1 through N−1)". Further, the other members in FIG. 9 are respectively the same members as the other members in FIG. 4, so that the numeral "4" in the reference numerals given to the members in FIG. 4 is replaced with the numeral "5" in FIG. 9.

In the AD conversion circuit equipped circuit 5 serving as an IC, a digital coefficient detection circuit of a digital coefficient detection/control circuit 5b can autonomously carry out detection of a coefficient s1k, and the digital control circuit of the digital coefficient detection/control circuit 5b can autonomously carry out the control. In this case, no instruction for the signal processing needs to be supplied from the outside of the IC.

Figure 10:
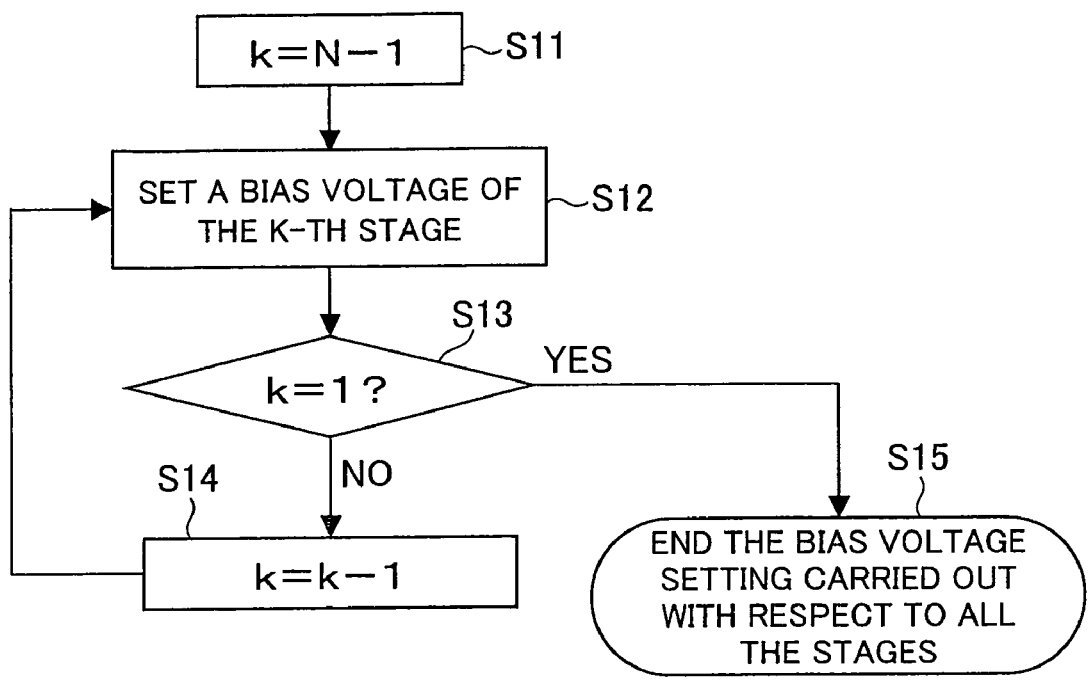
FIG. 10 is a flowchart illustrating a flow of bias voltage setting carried out by the electronic circuit apparatus shown in FIG. 9.

The following explains a control method adopted in cases where the bias voltage generation circuits are so provided as to respectively correspond to the first stage through the (N−1)-th stage. The control may be carried out individually with respect to the stages, in a random order; however, it is efficient that the control is carried out in accordance with a flowchart shown in FIG. 10.

Generally, a correction type AD conversion circuit finds a coefficient of the (N−1)-th stage by using a digital output of the N-th stage, and finds a coefficient of the (N−2)-th stage by using (i) the digital output of the N-th stage and (ii) a digital output of the (N−1)-th stage whose coefficient has been already found. In this way, the correction is carried out sequentially from a subsequent stage toward a preceding stage. The bias voltage setting is carried out in a similar manner. Specifically, the following is carried out for the purpose of optimizing a current to be supplied to the entire pipeline AD conversion circuit made up of the stages. That is, "k" is firstly set at "(N−1)" in S11 (step 11) shown in FIG. 10. Carried out thereafter in S12 is setting of a bias voltage Vb of the k-th stage, i.e., the (N−1)-th stage such that a current to be supplied to the (N−1)-th stage is determined in accordance with the correction value of the (N−1)-th stage. The method for setting each of the bias voltages of the stages is fully explained above with reference to FIG. 8. Carried out next in S13 is judgment whether or not k is 1. In cases where k is not 1, the sequence goes to S14. In S14, "k−1" is carried out, and the result is substituted in "k". Thereafter, the sequence goes back to S12. Carried out thereafter in S12 is setting of a bias voltage Vb of the k-th stage, i.e., the (N−2)-th stage such that a current to be supplied to the (N−2)-th stage is determined in accordance with the correction value of the (N−2)-th stage. The (N−1)-th stage, which is operating in the pipeline manner on this occasion in accordance with the determined bias voltage Vb, outputs a digital output. In accordance with the respective digital outputs of the N-th stage and (N−1)-th stage, the coefficient of the (N−2)-th stage is found. In this way, the setting of the bias voltages Vb is carried out from a subsequent stage toward a preceding stage. When k is 1 in S13, i.e., when the setting of the bias voltages Vb allowing optimal current supply for each of the stages is finished after setting the bias voltage of the first stage, the sequence goes to S15, with the result that the setting of the bias voltages Vb for all the stages is terminated. This allows the pipeline AD conversion circuit 5a to operate with the use of such an optimal current.

In cases where the bias voltage generation circuits are so provided as to respectively correspond to the stages, which includes amplifiers, of the pipeline AD conversion circuit 5a, the AD conversion circuit equipped circuit 5 may be arranged such that the bias setting signal s3 can be set for each of the stages of the pipeline AD conversion circuit 5a. With this, the bias voltage Vb can be set only in a required stage, as required.

As described above, according to the present embodiment, the bias voltage generation circuits are so provided as to correspond to the stages, each of which includes the two-time amplifier circuit 111, of the pipeline AD conversion circuit 5a. This makes it possible that only the bias voltage Vb of a required stage is set as required.

Further, the setting of the bias voltages Vb is carried out sequentially from a subsequent stage toward a preceding stage, so that an optimal bias voltage Vb can be set in each of the stages. Accordingly, each of the stages of the pipeline AD conversion circuit 5a can operate with an optimal current.

Further, the setting of the bias voltages Vb is carried out from (i) the last stage, which includes the two-time amplifier circuit 111, of the pipeline AD conversion circuit 5a, to (ii) the first stage thereof. Therefore, an optimal bias voltage Vb can be set in each of the stages. Accordingly, each of the stages of the pipeline AD conversion circuit 5a can operate with an optimal current.

Further, the bias voltage generation circuits of the stages of the pipeline AD conversion circuit 5a are individually brought to be operable, upon the reception of the bias voltage setting signal s3 from the outside. As such, the use of the bias voltage setting signal s3 makes it possible that only the bias voltage of a required stage is set as required.

Further, the coefficient obtained on this occasion can be always monitored via the external output terminal 5T. Therefore, the coefficient can be used for the quality judgment, and the intervention to the autonomous current control system can be carried out as required. The intervention is carried out by controlling, from the outside, the bias voltage setting signal s3. Such intervention can be carried out because each of the bias voltage generation circuits 5d is not necessarily required to use the bias voltage control signal corresponding to the monitored coefficient. Therefore, in some cases, a control signal may be intentionally used which allows application of a voltage lower or higher than the bias voltage corresponding to the coefficient thus obtained. Such voltage application from the outside causes the bias voltage to fall out of the range of the prepared table of the combination of the predetermined coefficient and the bias voltage control signal. In this way, the intervention is carried out with respect to the autonomous current control system.

Heretofore, Embodiments are described. Note that each of the aforementioned electronic circuit apparatuses may be an analog circuit, or be a circuit including an analog circuit and a digital circuit. Note also that examples of the electronic circuit apparatus include: a camera module serving as a device unit; and a mobile electronic apparatus (mobile phone, etc.,) serving as a commercial product.

Further, the electronic circuit apparatus may be an IC in which the coefficient detection circuit, the control circuit, and the correction circuit are packaged together with the analog circuit and the AD conversion circuit; however, the electronic circuit apparatus is not limited to this. That is, the electronic circuit apparatus may be arranged such that IC packages individually including the above circuits are connected with one another via pins.

Further, one control circuit for controlling the analog circuit may be provided for one analog circuit, which is targeted for the detection of the predetermined property. Alternatively, one control circuit may be provided for a plurality of analog circuits. Alternatively, a plurality of control circuits may be provided for one analog circuit.

Further, in cases where there are a plurality of predetermined properties targeted for the detection, the detection means may detects the detection targets as a coefficient. This makes it possible to detect the detection targets effectively.

Further, in cases where the coefficient detection and the control carried out by the control means are carried out autonomously in the IC, no instruction for the signal processing needs to be provided from the outside of the IC.

Further, it is preferable to arrange the electronic circuit apparatus of the present embodiment such that: the predetermined property is at least one of (i) a property acquired in a step of steps of manufacturing the electronic circuit apparatus, and (ii) a property acquired while the electronic circuit apparatus is used.

The embodiment above makes it possible that: (i) only when manufacturing the electronic circuit apparatus, the predetermined property of the analog circuit is detected so as to find the manufacture unevenness of the analog circuits; (ii) only when using the electronic circuit apparatus, the predetermined property of the analog circuit is detected so as to find (a) the manufacture unevenness of the analog circuits, (b) how the electronic circuit apparatus is used, and (c) the secular variation; or (iii) when manufacturing and using the electronic circuit apparatus, the predetermined property of the analog circuit is detected. With this, a property beneficial for the user can be found.

It is preferable to arrange the electronic circuit apparatus of the present embodiment such that: the coefficient detected by the detection means represents one or more detection targets of the analog circuit.

The embodiment makes it possible to process, as a signal, the predetermined property of the analog circuit and the condition outside the analog circuit.

It is preferable to arrange the electronic circuit apparatus such that: the coefficient detected by the detection means is found by carrying out calculation, and represents the plurality of detection targets of the analog circuit.

The embodiment makes it possible to detect the detection targets efficiently.

It is preferable to arrange the electronic circuit apparatus of the present embodiment such that: the coefficient is a digital signal, and the detection circuit is a circuit for carrying out digital processing.

The embodiment makes it possible that: when the circuit including the analog circuit outputs the coefficient as a digital value, the digital processing is carried out with respect to the digital output value. With this, the digital output of the circuit including the analog circuit is utilized most efficiently. Accordingly, no additional analog circuit needs to be provided.

It is preferable to arrange the electronic circuit apparatus of the present embodiment such that: an operation state of the analog circuit is adjusted in accordance with a digital signal, and the control circuit is a circuit for (i) carrying out digital processing in accordance with the detection result so as to generate the signal for adjusting the operation state of the analog circuit, and (ii) sending the signal.

The embodiment makes it possible that: when the circuit including the analog circuit outputs the coefficient as the digital value, the control circuit receives the digital output value, and carries digital processing with respect to the digital value thus received. With this, the digital output of the circuit including the analog circuit is utilized most efficiently. Accordingly, no additional analog circuit needs to be provided.

It is preferable to arrange the electronic circuit apparatus such that: the detection of the coefficient, the control carried out by the control circuit are carried out autonomously in an integrated circuit.

According to the embodiment, no instruction for the signal processing needs to be given from the outside of the IC.

It is preferable to arrange the electronic circuit apparatus of the present embodiment such that: the analog circuit includes one or more amplifiers, and the control means adjusts current consumption of the analog circuit by adjusting current consumption of the amplifier.

The embodiment allows restraint of the current consumption of the amplifier.

It is preferable to arrange the electronic circuit of the present embodiment such that: the analog circuit includes a bias voltage generation circuit for generating one or more bias voltages to be applied to the one or more amplifiers, and the control means varies the bias voltage to be generated by the bias voltage generation circuit, so as to adjust the current consumption of the analog circuit.

The embodiment makes it possible to set the bias voltage, which is to be applied from the bias voltage generation circuit to each of the amplifiers whose properties are uneven (different from one another), such that a minimally required current is to be supplied to the amplifier. This allows restraint of the current consumption.

It is preferable to arrange the electronic circuit apparatus of the present embodiment such that: the bias voltage to be generated by the bias voltage generation circuit is varied according to a current supplied to the bias voltage generation circuit.

According to the embodiment, in the case of using the bias voltage generation circuit for varying the bias voltage in accordance with the input current, the current consumption of the amplifier can be restrained.

It is preferable to arrange the electronic circuit apparatus of the present embodiment such that: the plurality of bias voltages to be generated by the bias voltage generation circuit are simultaneously varied according to the current supplied to the bias voltage generation circuit.

According to the embodiment, in the case of using the bias voltage generation circuit using a plurality of bias voltages for the amplifiers, the current consumption of each amplifier can be restrained.

It is preferable to arrange the electronic circuit apparatus of the present embodiment such that: the bias voltage generation circuit is a DA conversion circuit for generating the bias voltage, which is varied according to a digital signal supplied to the bias voltage generation circuit.

According to the embodiment, the bias voltage to be generated and supplied to the analog circuit can be varied by varying the input digital signal. This makes it possible to effectively control the bias voltage by using the digital signal obtained by processing the coefficient, which is the digital value and which is sent from the AD conversion circuit.

It is preferable to arrange the electronic circuit apparatus of the present embodiment such that: the bias voltage generation circuit generates the plurality of bias voltages, and includes a plurality of DA conversion circuits which are so provided as to correspond to the plurality of bias voltages.

According to the embodiment, the bias voltage generation circuits can change the bias voltages with the use of the DA conversion circuits, respectively.

It is preferable to arrange the electronic circuit apparatus of the present embodiment such that: a number of the DA conversion circuits provided in the bias voltage generation circuit corresponds to a number of the bias voltages to be supplied to the amplifiers.

According to the embodiment, the number of the bias voltages generated by the bias voltage generation circuit corresponds to the number of the bias voltages to be used by the amplifiers. This makes it possible to generate the bias voltages effectively.

It is preferable to arrange the electronic circuit apparatus of the present embodiment such that: the bias voltage generation circuit becomes operable when receiving a bias voltage setting signal from outside.

According to the embodiment, the bias voltage generation circuit becomes operable only when the bias voltage needs to be set again. This allows electric power consumption reduction.

It is preferable to arrange the electronic circuit apparatus of the present embodiment such that: the control circuit recursively varies the bias voltage to be generated by the bias voltage generation circuit, until the coefficient coincides with a predetermined convergence value.

According to the embodiment, for the determination of the bias voltage Vb, the bias voltage Vb to be applied to the amplifier is varied until the correction value is converged to a required correction value. This makes it possible that the most appropriate bias voltage Vb is always applied to the amplifier.

It is preferable that the electronic circuit apparatus of the present embodiment further includes: correction circuit for correcting, in accordance with the coefficient, an output result corresponding to an operation state of the analog circuit.

The embodiment makes it possible to correct an error of the output of the circuit including the analog circuit.

It is preferable to arrange the electronic circuit apparatus of the present embodiment such that: the analog circuit is an AD conversion circuit for (i) converting an analog input signal into a digital value, and (ii) outputting the digital value.

The embodiment finds the coefficient indicative of (i) each of the uneven predetermined properties of the analog circuits, and (ii) the operation state including the condition outside each of the analog circuits. Further, the embodiment can control the circuit including the analog circuit, by adjusting the operation state of the analog circuit in accordance with the predetermined property thus found. This allows for (i) accuracy improvement whose realization is difficult merely by controlling the parameter of the analog circuit, and (ii) current consumption reduction. This allows realization of an electronic circuit apparatus, which can use the analog circuit of the manufactured AD conversion circuit with good accuracy, and which can reduce the electric power consumption and the circuit scale of the analog circuit.

It is preferable that the electronic circuit apparatus of the present embodiment further include: correction circuit for correcting, in accordance with the coefficient, the digital value obtained through the AD conversion carried out by the AD conversion circuit.

According to the embodiment, an AD conversion error of the AD conversion circuit can be corrected.

It is preferable to arrange the electronic circuit apparatus of the present embodiment such that the AD conversion circuit is a pipeline AD conversion circuit.

According to the embodiment, the pipeline AD conversion circuit is an AD conversion circuit which is excellent in terms of balance of conversion speed, conversion accuracy, and current consumption. Therefore, the analog circuit of such a pipeline AD conversion circuit outputs a signal whose quality is good to some extent even before the correction, when the operation state adjustment is carried out in accordance with (i) the detected predetermined property of the analog circuit of the pipeline AD conversion circuit and (ii)

the detected operation state including the outer condition. Accordingly, in the case of providing the correction circuit for correcting the digital result obtained by the AD conversion carried out by the AD conversion circuit, load imposed on the correction circuit can be reduced.

It is preferable to arrange the electronic circuit apparatus of the present embodiment such that: the coefficient is an index of a gain of an amplifier of each of stages of the pipeline AD conversion circuit.

According to the embodiment, in the structure for correcting and outputting the AD conversion result, the gain used for the coefficient is found in the first place for the AD conversion. Therefore, no new circuit is required for the generation of the coefficient.

It is preferable to arrange the electronic circuit apparatus of the present embodiment such that: the coefficient is an index of a gain error of an amplifier of each of stages of the pipeline AD conversion circuit.

According to the embodiment, in the structure for correcting and outputting the AD conversion result, the gain error used for the coefficient is found in the first place for the AD conversion. Therefore, no new circuit is required for the generation of the coefficient.

It is preferable to arrange the electronic circuit apparatus of the present embodiment such that: bias voltage generation circuits for generating bias voltages to be supplied to the amplifiers of the pipeline AD conversion circuit are provided in the stages of the pipeline AD conversion circuit, respectively.

According to the embodiment, the bias voltages of the stages can be set, respectively.

It is preferable to arrange the electronic circuit apparatus such that setting of the bias voltages is carried out from a subsequent stage toward a preceding stage.

According to the embodiment, an optimal bias voltage Vb can be set in each of the stages. Accordingly, each of the stages of the pipeline AD conversion circuit can operate with an optimal current.

It is preferable to arrange the electronic circuit apparatus of the present embodiment such that: the setting of the bias voltages is carried out sequentially in an order from (i) a last stage of the stages which respectively includes the amplifiers, to (ii) a first stage of the stages.

According to the embodiment, an optimal bias voltage Vb can be set in all the stages. Accordingly, each of the stages of the pipeline AD conversion circuit can operate with an optimal current.

It is preferable to arrange the electronic circuit apparatus of the present embodiment such that: the bias voltage generation circuits respectively provided in the stages of the pipeline AD conversion circuit are individually brought to be operable, when each of the bias voltage generation circuits receives a bias voltage setting signal from outside.

According to the embodiment, the supply of the bias voltage setting signal from the outside makes it possible that only the bias voltage of a required stage is set as required.

The present invention is suitably applicable to an electronic circuit apparatus including an AD conversion circuit, particularly to an electronic circuit apparatus including a pipeline AD conversion circuit.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. An electronic circuit apparatus, comprising:
   an analog circuit;
   detection means for detecting a predetermined property of the analog circuit as a coefficient; and
   control means for adjusting electric power consumption of the analog circuit in accordance with a detection result acquired from the detection means, wherein
   the coefficient detected by the detection means being sent out from an external output terminal.

2. The electronic circuit apparatus as set forth in claim 1, wherein:
   the predetermined property is at least one of (i) a property acquired in a step of steps of manufacturing the electronic circuit apparatus, and (ii) a property acquired while the electronic circuit apparatus is used.

3. The electronic circuit apparatus as set forth in claims 1, wherein:
   the coefficient detected by the detection means represents one or more detection targets of the analog circuit.

4. The electronic circuit apparatus as set forth in claim 3, wherein:
   the coefficient detected by the detection means is found by carrying out calculation, and represents the plurality of detection targets of the analog circuit.

5. The electronic circuit apparatus as set forth in claim 4, wherein:
   the coefficient is a digital signal, and
   the detection means is a circuit for carrying out digital processing.

6. The electronic circuit apparatus as set forth in claim 3, wherein:
   an operation state of the analog circuit is adjusted in accordance with a digital signal, and
   the control means is a circuit for (i) carrying out digital processing in accordance with the detection result so as to generate the signal for adjusting the operation state of the analog circuit, and (ii) sending the signal.

7. The electronic circuit apparatus as set forth in claim 6, wherein:
   the detection of the coefficient, the control carried out by the control means are carried out autonomously in an integrated circuit.

8. The electronic circuit apparatus as set forth in claim 1, wherein:
   the analog circuit includes one or more amplifiers, and
   the control means adjusts current consumption of the analog circuit by adjusting current consumption of the amplifier.

9. The electronic circuit as set forth in claim 8, wherein:
   the analog circuit includes a bias voltage generation circuit for generating one or more bias voltages to be applied to the one or more amplifiers, and
   the control means varies the bias voltage to be generated by the bias voltage generation circuit, so as to adjust the current consumption of the analog circuit.

10. The electronic circuit apparatus as set forth in claim 9, wherein:
    the bias voltage to be generated by the bias voltage generation circuit is varied according to a current supplied to the bias voltage generation circuit.

11. The electronic circuit apparatus as set forth in claim 10, wherein:

the plurality of bias voltages to be generated by the bias voltage generation circuit are simultaneously varied according to the current supplied to the bias voltage generation circuit.

12. The electronic circuit apparatus as set forth in claim 11, wherein:
the bias voltage generation circuit is a DA conversion circuit for generating the bias voltage, which is varied according to a digital signal supplied to the bias voltage generation circuit.

13. The electronic circuit apparatus as set forth in claim 11, wherein:
the bias voltage generation circuit generates the plurality of bias voltages, and includes a plurality of DA conversion circuits which are so provided as to correspond to the plurality of bias voltages.

14. The electronic circuit apparatus as set forth in claim 13, wherein:
a number of the DA conversion circuits provided in the bias voltage generation circuit corresponds to a number of the bias voltages to be supplied to the amplifiers.

15. The electronic circuit apparatus as set forth in claim 9, wherein:
the bias voltage generation circuit becomes operable when receiving a bias voltage setting signal from outside.

16. The electronic circuit apparatus as set forth in claim 9, wherein:
the control means recursively varies the bias voltage to be generated by the bias voltage generation circuit, until the coefficient coincides with a predetermined convergence value.

17. The electronic circuit apparatus as set forth in claim 1, further comprising:
correction means for correcting, in accordance with the coefficient, an output result corresponding to an operation state of the analog circuit.

18. The electronic circuit apparatus as set forth in claims 1, wherein:
the analog circuit is an AD conversion circuit for (i) converting an analog input signal into a digital value, and (ii) outputting the digital value.

19. The electronic circuit apparatus as set forth in claim 18, further comprising:
correction means for correcting, in accordance with the coefficient, the digital value obtained through the AD conversion carried out by the AD conversion circuit.

20. The electronic circuit apparatus as set forth in claim 18, wherein:
the AD conversion circuit is a pipeline AD conversion circuit.

21. The electronic circuit apparatus as set forth in claim 20, wherein:
the coefficient is an index of a gain of an amplifier of each of stages of the pipeline AD conversion circuit.

22. The electronic circuit apparatus as set forth in claim 20, wherein:
the coefficient is an index of a gain error of an amplifier of each of stages of the pipeline AD conversion circuit.

23. The electronic circuit apparatus as set forth in claim 20, wherein:
bias voltage generation circuits for generating bias voltages to be supplied to the amplifiers of the pipeline AD conversion circuit are provided in the stages of the pipeline AD conversion circuit, respectively.

24. The electronic circuit apparatus as set forth in claim 23, wherein:
setting of the bias voltages is carried out from a subsequent stage toward a preceding stage.

25. The electronic circuit apparatus as set forth in claim 24, wherein:
the setting of the bias voltages is carried out sequentially in an order from (i) a last stage of the stages which respectively includes the amplifiers, to (ii) a first stage of the stages.

26. The electronic circuit apparatus as set forth in claim 23, wherein:
the bias voltage generation circuits respectively provided in the stages of the pipeline AD conversion circuit are individually brought to be operable, when each of the bias voltage generation circuits receives a bias voltage setting signal from outside.

27. An electronic circuit apparatus, comprising:
an analog circuit;
detection means for detecting a predetermined property of the analog circuit as a coefficient; and
control means for adjusting current consumption of the analog circuit in accordance with a detection result acquired from the detection means, wherein
the coefficient detected by the detection means being sent out from an external output terminal.

* * * * *